(12) United States Patent
Oh

(10) Patent No.: US 11,943,915 B2
(45) Date of Patent: Mar. 26, 2024

(54) THREE-DIMENSIONAL MEMORY DEVICE WITH VIAS CONNECTED TO STAIRCASE STRUCTURE

(71) Applicant: SK hynix Inc., Icheon-si (KR)

(72) Inventor: Sung Lae Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 176 days.

(21) Appl. No.: 17/170,050

(22) Filed: Feb. 8, 2021

(65) Prior Publication Data

US 2022/0108999 A1 Apr. 7, 2022

(30) Foreign Application Priority Data

Oct. 6, 2020 (KR) .................. 10-2020-0128435

(51) Int. Cl.
| | |
|---|---|
| *H10B 41/27* | (2023.01) |
| *H01L 23/522* | (2006.01) |
| *H10B 41/10* | (2023.01) |
| *H10B 41/46* | (2023.01) |
| *H10B 43/10* | (2023.01) |
| *H10B 43/27* | (2023.01) |

(52) U.S. Cl.
CPC ......... *H10B 41/27* (2023.02); *H01L 23/5226* (2013.01); *H10B 41/10* (2023.02); *H10B 41/46* (2023.02); *H10B 43/10* (2023.02); *H10B 43/27* (2023.02)

(58) Field of Classification Search
CPC ........ H10B 41/27; H10B 41/10; H10B 43/10; H10B 43/27; H10B 41/46; H01L 23/5226
See application file for complete search history.

(56) References Cited

U.S. PATENT DOCUMENTS

| | | | | |
|---|---|---|---|---|
| 9,202,744 | B1 * | 12/2015 | Ban .................... | H01L 23/5226 |
| 2011/0044112 | A1 * | 2/2011 | Torii .................... | H10B 41/30 |
| | | | | 257/315 |
| 2017/0062470 | A1 * | 3/2017 | Han .................... | H10B 43/10 |
| 2020/0058667 | A1 * | 2/2020 | Baek .................... | H10B 41/27 |
| 2020/0273877 | A1 * | 8/2020 | Yun .................... | G11C 16/0483 |

FOREIGN PATENT DOCUMENTS

| | | |
|---|---|---|
| KR | 1020170027334 A | 3/2017 |
| KR | 10-2021-0145417 A | 12/2021 |

* cited by examiner

*Primary Examiner* — Thao X Le
*Assistant Examiner* — Sean Ayers Winters

(57) ABSTRACT

A three-dimensional memory device includes a lower stack and an upper stack stacked one on the other, and each including a plurality of word lines which are stacked alternately with a plurality of interlayer dielectric layers, wherein each of the lower stack and the upper stack includes a first cell part, a second cell part, a coupling part which couples the first cell part and the second cell part, and a staircase part which extends parallel to the coupling part from the first cell part and in which pad areas of the word lines are disposed in a stepwise manner, and wherein the coupling part of the upper stack is disposed to overlap with the staircase part of the lower stack, and the staircase part of the upper stack is disposed to overlap with the coupling part of the lower stack.

16 Claims, 51 Drawing Sheets

US 11,943,915 B2

THREE-DIMENSIONAL MEMORY DEVICE WITH VIAS CONNECTED TO STAIRCASE STRUCTURE

CROSS-REFERENCE TO RELATED APPLICATION

The present application claims priority under 35 U.S.C. § 119(a) to Korean Patent Application No. 10-2020-0128435 filed in the Korean Intellectual Property Office on Oct. 6, 2020, which is incorporated herein by reference in its entirety.

BACKGROUND

1. Technical Field

Various embodiments generally relate to a semiconductor technology, and particularly, to a three-dimensional memory device and a manufacturing method thereof.

2. Related Art

A three-dimensional memory device has advantages in that a larger capacity may be realized within the same area by increasing the number of stacks through stacking memory cells in a vertical direction, thereby providing higher performance and excellent power efficiency.

In the three-dimensional memory device, the degree of integration may be increased by increasing the number of word lines to be stacked. However, if the number of word lines is increased, then the number of wiring lines needed to couple the word lines and a row decoder increases, and thus, the degree of integration may decrease. Therefore, an efficient wiring line layout method is required.

SUMMARY

Various embodiments are directed to a three-dimensional memory device with an improved degree of integration and methods of manufacturing such devices.

In an embodiment, a three-dimensional memory device may include: a lower stack and an upper stack stacked in a vertical direction, and each including a plurality of word lines stacked alternately in the vertical direction with a plurality of interlayer dielectric layers, wherein each of the lower stack and the upper stack includes a first cell part, a second cell part, a coupling part that couples the first cell part and the second cell part, and a staircase part that extends parallel to the coupling part between the first cell part and the second cell part and that includes a plurality of pad areas, which are arranged in a stepwise manner and correspond to the plurality of word lines, and wherein the coupling part of the upper stack is disposed to overlap with the staircase part of the lower stack in the vertical direction, and the staircase part of the upper stack is disposed to overlap with the coupling part of the lower stack in the vertical direction.

In an embodiment, a method for manufacturing a three-dimensional memory device may include: forming a first pre-stack by alternately stacking a plurality of first interlayer dielectric layers and a plurality of first sacrificial layers in the vertical direction; forming, in the first pre-stack, a first staircase part which exposes the plurality of first sacrificial layers in a stepwise manner; forming a plurality of first vertical vias, which pass through the first staircase part, and a plurality of second vertical vias that pass through a first coupling part of the first pre-stack, which is disposed parallel to the first staircase part of the first pre-stack; forming a second pre-stack by alternately stacking a plurality of second interlayer dielectric layers and a plurality of second sacrificial layers on the first pre-stack; forming, in the second pre-stack, a second staircase part which overlaps with the first coupling part in the vertical direction and exposes the plurality of second sacrificial layers in a stepwise manner; forming a plurality of third vertical vias, which are coupled to the plurality of first vertical vias by passing through a second coupling part of the second pre-stack that overlaps with the first staircase part in the vertical direction, and a plurality of fourth vertical vias which are coupled to the plurality of second vertical vias by passing through the second staircase part; and replacing the first and second sacrificial layers with an electrode material.

DETAILED DESCRIPTION

Figure 1:
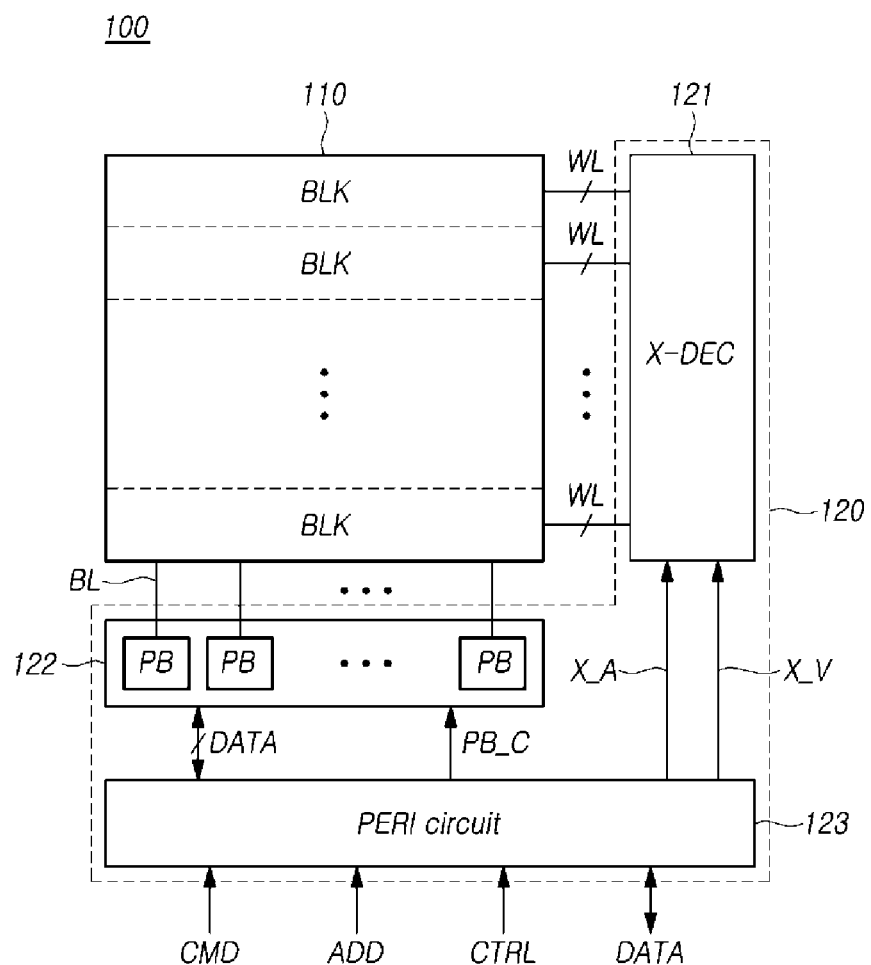
FIG. 1 is a block diagram schematically illustrating a three-dimensional memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

Because the figures, dimensions, ratios, angles, numbers of elements given in the drawings that describe embodiments of the disclosure are merely illustrative, the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article (e.g., "a," "an" or "the") is used when referring to a singular noun, the article may include a plural of that noun unless specifically stated otherwise.

In interpreting elements in embodiments of the disclosure, they should be interpreted as including error margins even in the absence of explicit statements.

Also, in describing the components of the disclosure, there may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram schematically illustrating a three-dimensional memory device in accordance with an embodiment of the disclosure.

Referring to FIG. 1, a three-dimensional memory device 100 in accordance with an embodiment of the disclosure may include a memory cell array 110 and a logic circuit 120. The logic circuit 120 may include a row decoder (X-DEC) 121, a page buffer circuit 122 and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, which are coupled in series. While the following descriptions represent some embodiments in which the disclosure is illustrated using a vertical NAND flash memory, it is to be noted that the disclosure is not limited thereto and other embodiments may include different types of memories.

The memory cell array 110 may be coupled to the row decoder 121 through a plurality of word lines WL. The memory cell array 110 may be coupled to the page buffer circuit 122 through a plurality of bit lines BL.

The row decoder 121 may select any one from among the memory blocks BLK included in the memory cell array 110, in response to a row address X_A provided from the peripheral circuit 123. The row decoder 121 may transfer an operating voltage X_V, provided from the peripheral circuit 123, to word lines WL coupled to a memory block BLK selected from among the memory blocks BLK included in the memory cell array 110.

The page buffer circuit 122 may include a plurality of page buffers PB which are coupled to the bit lines BL, respectively. The page buffer circuit 122 may receive a page buffer control signal PB_C from the peripheral circuit 123, and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data, stored in a memory cell of the memory cell array 110, by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL based on the data signal DATA, received from the peripheral circuit 123, in response to the page buffer control signal PB_C, and thereby, may write data to a memory cell of the memory cell array 110. The page buffer circuit 122 may write data to or read data from memory cells, which are coupled to an activated word line.

The peripheral circuit 123 may receive a command signal CMD, an address signal ADD and a control signal CTRL from outside the memory device 100, and may transmit and receive data DATA to and from a device outside the memory device 100, for example, a memory controller. The peripheral circuit 123 may output signals for writing data to the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the memory device 100.

As the size of an electronic product, and in particular a mobile product, in which the memory device 100 is mounted decreases, continuously reducing the size of the memory device 100 is demanded. As the stack number of the word lines WL is increased due to a demand for high capacity, the number of wiring lines that couple the word lines WL and the row decoder 121 is being increased. In order to suppress an increase in the size of the memory device 100 due to an increase in the number of wiring lines and in order to increase the degree of integration, an efficient wiring line layout method is required.

Figure 2:
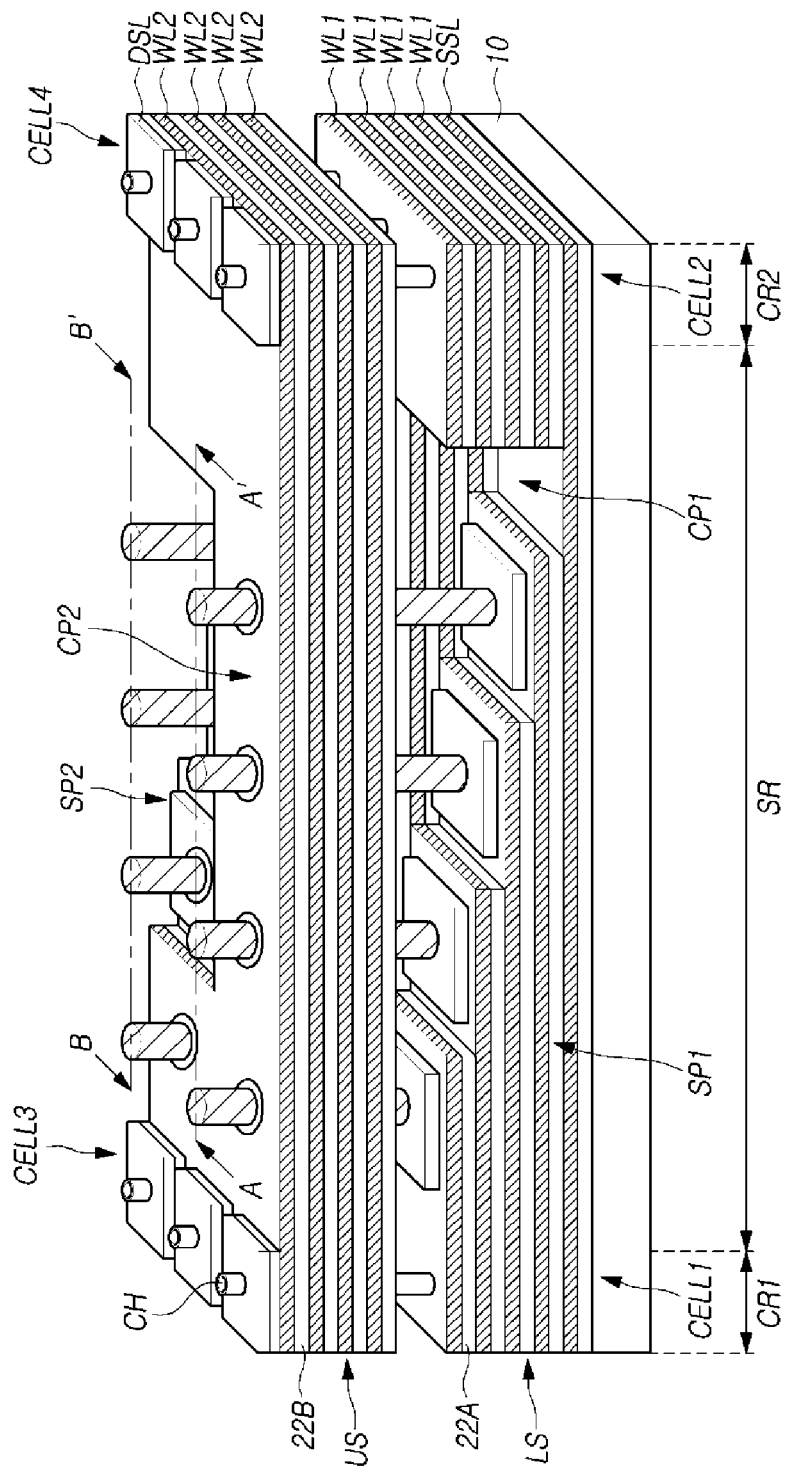
FIG. 2 is a perspective view illustrating a part of a three-dimensional memory device in accordance with an embodiment of the disclosure.
Figure 3A:
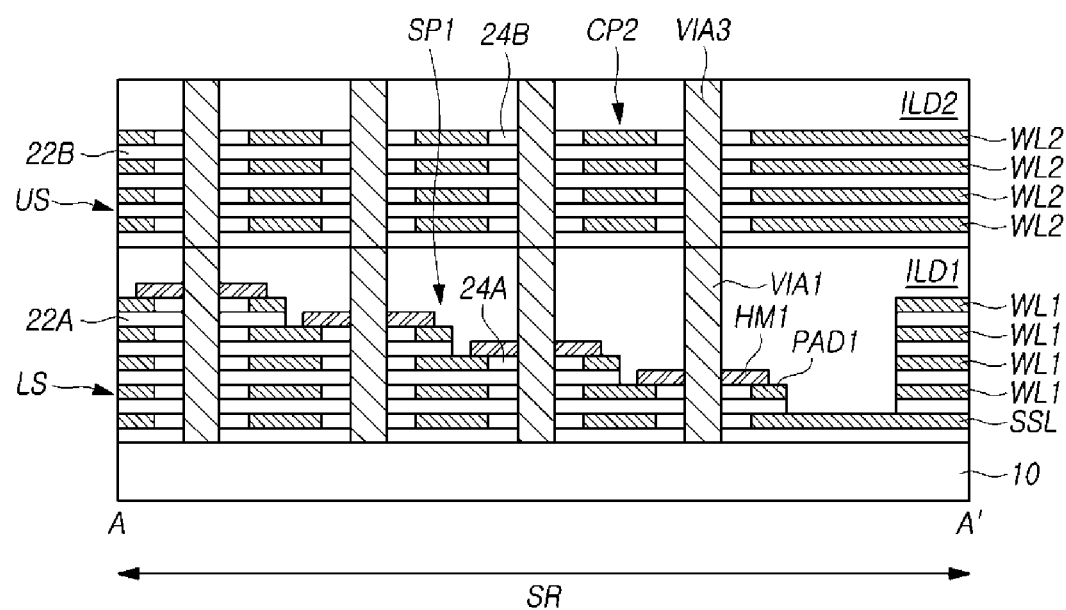
FIG. 3A is a cross-sectional view taken along a line A-A' of FIG. 2.

FIG. 2 is a perspective view illustrating a part of a three-dimensional memory device in accordance with an embodiment of the disclosure. FIG. 3A is a cross-sectional view taken along a line A-A' of FIG. 2, FIG. 3B is a cross-sectional view taken along a line B-B' of FIG. 2, and FIG. 4 is a perspective view illustrating an upper stack and a lower stack of FIG. 2.

Figure 3B:
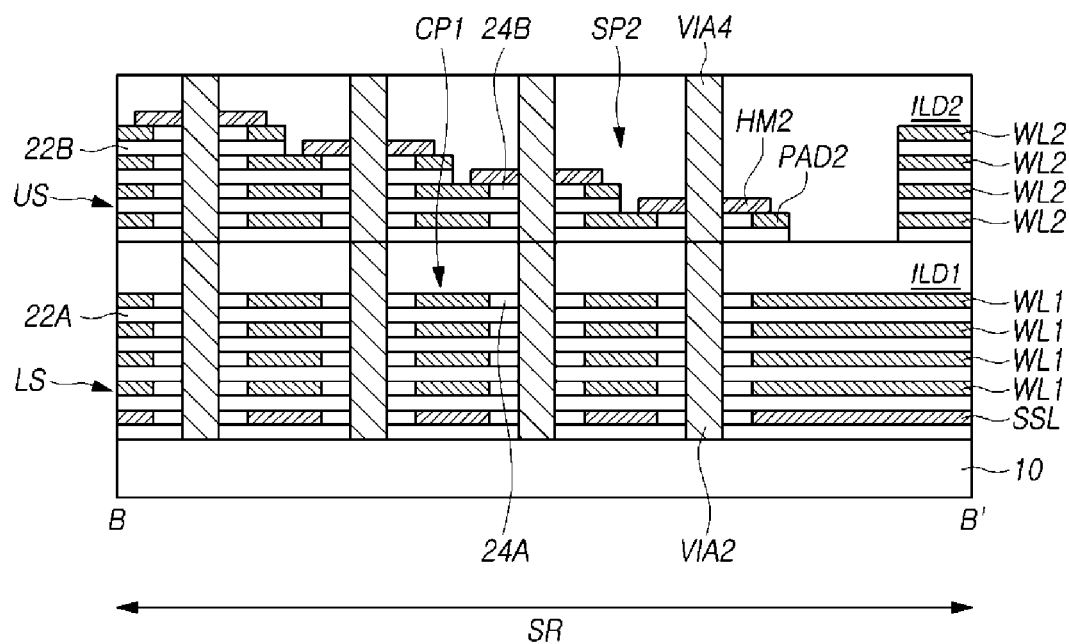
FIG. 3B is a cross-sectional view taken along a line B-B' of FIG. 2.
Figure 4:
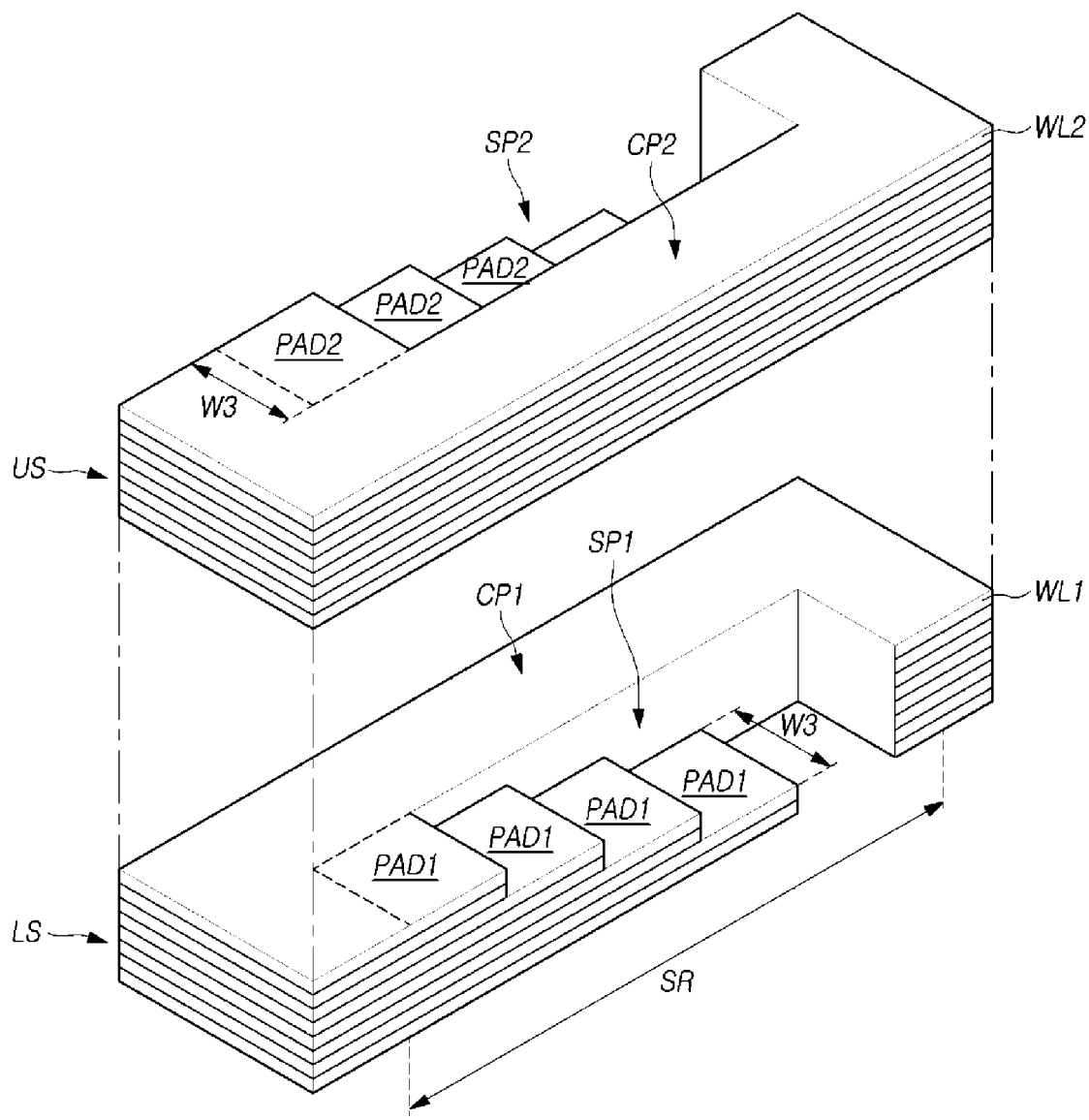
FIG. 4 is a perspective view illustrating an upper stack and a lower stack of FIG. 2.

Referring to FIGS. 2, 3A and 3B, a three-dimensional memory device in accordance with an embodiment of the disclosure may include a substrate 10, a lower stack LS that is disposed on the substrate 10, and an upper stack US that is disposed on or over the lower stack LS.

The lower stack LS may include a plurality of first word lines WL1 that are stacked alternately with a plurality of interlayer dielectric layers 22A, and the upper stack US may include a plurality of second word lines WL2 that are stacked alternately with a plurality of interlayer dielectric layers 22B.

The first word lines WL1 and the second word lines WL2 may include a conductive material. For example, the first word lines WL1 and the second word lines WL2 may include at least one selected from among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). The interlayer dielectric layers 22A and 22B may include silicon oxide.

The lower stack LS may further include a source select line SSL, which is disposed under the plurality of first word lines WL1, and the upper stack US may further include a drain select line DSL, which is disposed on or over the plurality of second word lines WL2.

The lower stack LS may include a first cell part CELL1, which is disposed in a first cell region CR1, a second cell part CELL2 which is disposed in a second cell region CR2, and a first staircase part SP1 and a first coupling part CP1, which are both disposed in a slimming region SR between the first cell region CR1 and the second cell region CR2.

The first coupling part CP1 may couple the first cell part CELL1 and the second cell part CELL2. The first staircase part SP1 may extend parallel to the first coupling part CP1, and may have a staircase shape, which is coupled to the first cell part CELL1 and descends in a direction toward the second cell part CELL2.

The upper stack US may include a third cell part CELL3, which is disposed in the first cell region CR1 and overlaps with the first cell part CELL1 in a vertical direction, and may include a fourth cell part CELL4, which is disposed in the second cell region CR2 and overlaps with the second cell part CELL2 in the vertical direction. The upper stack US may include a second staircase part SP2 and a second coupling part CP2, which are both disposed in the slimming region SR.

The second coupling part CP2 may couple the third cell part CELL3 and the fourth cell part CELL4. The second staircase part SP2 may extend parallel to the second coupling part CP2, and may have a staircase shape that is coupled to the third cell part CELL3 and descends in the direction toward the fourth cell part CELL4.

Referring to FIG. 4, each of the first word lines WL1 included in the lower stack LS may have a first pad area PAD1. The first pad areas PAD1 of the first word lines WL1 may be disposed in a staircase shape in the first staircase part SP1.

Similar to the lower stack LS, each of the second word lines WL2 included in the upper stack US may have a second pad area PAD2. The second pad areas PAD2 of the second word lines WL2 may be disposed in a staircase shape in the second staircase part SP2.

The second staircase part SP2 of the upper stack US may overlap with the first coupling part CP1 of the lower stack LS in the vertical direction, and the second coupling part CP2 of the upper stack US may overlap with the first staircase part SP1 of the lower stack LS in the vertical direction. The first staircase part SP1 of the lower stack LS and the second staircase part SP2 of the upper stack US may not vertically overlap with each other. Accordingly, the first pad areas PAD1 and the second pad areas PAD2 may be disposed in relatively different positions, both horizontally and vertically.

Referring again to FIG. 2, a plurality of vertical channels CH, which pass through the lower stack LS and the upper stack US, may be defined in the first cell region CR1 and the second cell region CR2.

While not illustrated in detail, each of the plurality of vertical channels CH may include a channel layer and a gate dielectric layer. The channel layer may include polysilicon or monocrystalline silicon, and may include, in some regions thereof, a p-type impurity such as boron (B). The gate dielectric layer may have a shape that surrounds the outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked.

A source select transistor may be configured in areas or regions where the source select line SSL surrounds the vertical channels CH. Memory cells may be configured in areas or regions where the plurality of first word lines WL1 and the plurality of second word lines WL2 surround the vertical channels CH. A drain select transistor may be configured in areas or regions where the drain select line DSL surrounds the vertical channels CH. The source select transistor, the plurality of memory cells and the drain select transistor, which are disposed in a line along one vertical channel CH, may configure one cell string.

The present embodiment illustrates a case in which the lower stack LS and the upper stack US are built up on the single substrate 10. Thus, the first word lines WL1 of the lower stack LS and the second word lines WL2 of the upper stack US may be coupled in common to a single cell string.

Referring again to FIGS. 3A and 3B, a first dielectric layer ILD1 may be formed on the lower stack LS to cover the lower stack LS. The upper stack US may be disposed on the first dielectric layer ILD1. A second dielectric layer ILD2 may be formed on the upper stack US to cover the upper stack US.

A plurality of first vertical vias VIA1 and a plurality of second vertical vias VIA2 may be defined to pass through the lower stack LS and the first dielectric layer ILD1. The plurality of first vertical vias VIA1 may correspond to the first pad areas PAD1, respectively, of the first staircase part SP1, and may pass through the first staircase part SP1 at the corresponding first pad areas PAD1. The plurality of second vertical vias VIA2 may pass through the first coupling part CP1.

A plurality of third vertical vias VIA3 and a plurality of fourth vertical vias VIA4 may be defined to pass through the upper stack US and the second dielectric layer ILD2. The plurality of third vertical vias VIA3 may pass through the second coupling part CP2, and may be coupled to the plurality of first vertical vias VIA1, respectively. The plurality of fourth vertical vias VIA4 may correspond to the second pad areas PAD2, respectively, of the second staircase part SP2, and may be coupled to the second vertical vias VIA2 by passing through the second staircase part SP2 at the corresponding second pad areas PAD2.

The first and second vertical vias VIA1 and VIA2 may be isolated from the first word lines WL1 by dielectric patterns 24A, which may be defined between outer walls of the plurality of first vertical vias VIA1 and the plurality of second vertical vias VIA2 and the plurality of first word lines WL1. The dielectric patterns 24A may be disposed alternately with the plurality of interlayer dielectric layers 22A along the outer walls of the plurality of first vertical vias VIA1 in the first staircase part SP1 and along the outer walls of the plurality of second vertical vias VIA2 in the first coupling part CP1. The dielectric patterns 24A may be formed of, for example, silicon oxide.

The third and fourth vertical vias VIA3 and VIA4 may be isolated from the second word lines WL2 by dielectric patterns 24B, which may be defined between outer walls of the plurality of third vertical vias VIA3 and the plurality of fourth vertical vias VIA4 and the plurality of second word lines WL2. The dielectric patterns 24B may be disposed alternately with the plurality of interlayer dielectric layers 22B along the outer walls of the plurality of third vertical vias VIA3 in the second coupling part CP2 and along the outer walls of the plurality of fourth vertical vias VIA4 in the second staircase part SP2. The dielectric patterns 24B may be formed of, for example, silicon oxide.

First hard mask patterns HM1 may be defined on the first pad areas PAD1, respectively, of the first word lines WL1. The first hard mask patterns HM1 may be made of a conductive material, and thereby, may electrically couple the first word lines WL1 and the first vertical vias VIA1 that correspond to each other, respectively.

Second hard mask patterns HM2 may be defined on the second pad areas PAD2, respectively, of the second word lines WL2. The second hard mask patterns HM2 may be made of a conductive material, and thereby, may electrically couple the second word lines WL2 and the fourth vertical vias VIA4 that correspond to each other, respectively.

The plurality of first vertical vias VIA1 and the plurality of third vertical vias VIA3 may be used to configure electrical paths for coupling the first word lines WL1 to a row decoder (not illustrated). The plurality of second vertical vias VIA2 and the plurality of fourth vertical vias VIA4 may be used to configure electrical paths for coupling the second word lines WL2 to the row decoder.

Although not illustrated, a logic structure including the row decoder may be disposed under the substrate 10 or on the second dielectric layer ILD2, and thereby, may overlap with the lower stack LS and the upper stack US in a vertical direction.

The logic structure, the lower stack LS and the upper stack US may be fabricated on a single wafer. The logic structure, however, may also be fabricated on a wafer separate from the lower stack LS and the upper stack US, and then, may be bonded by a bonding technique, such as for example, hybrid bonding. Because the logic structure overlaps, in the vertical direction, with the lower stack LS and the upper stack US, which configure a memory cell array (110 of FIG. 1), a planar area occupied by the three-dimensional memory device may be reduced, and the degree of integration of the three-dimensional memory device may be increased.

Figure 5:
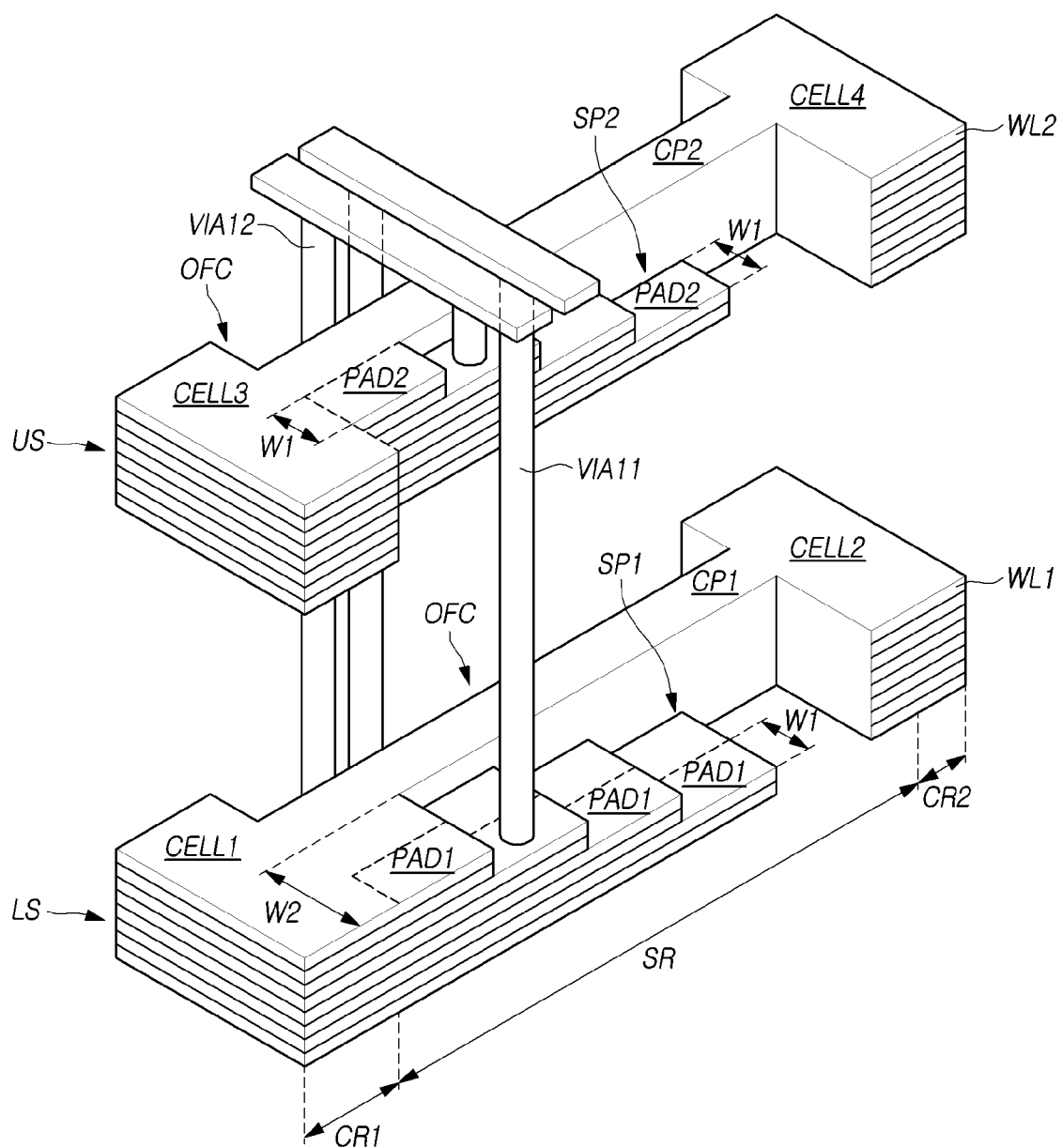
FIG. 5 is a perspective view illustrating a memory device in relation to the disclosure.

FIG. 5 is a perspective view illustrating a memory device in relation to the disclosure.

Referring to FIG. 5, in order to provide a space in which vertical vias VIA12 are disposed for coupling first word lines WL1 of a lower stack LS and second word lines WL2 of an upper stack US to a row decoder (not illustrated), an opening OFC may be formed in the lower stack LS and the upper stack US in a slimming region SR.

If the number of word lines is increased to improve the degree of integration, then the number of the vertical vias VIA12 will need to increase by the number of increased word lines. However, because the number of the vertical vias VIA12 that can be disposed in the opening OFC is limited, any increase in the degree of integration may be restricted or limited.

Further, in order to couple vertical vias VIA11 to pad areas, a width W1 of a second staircase part SP2 of the upper stack US may be smaller than a width W2 of a first staircase part SP1 of the lower stack LS so as to expose first pad areas PAD1 of the lower stack LS. Due to this fact, the widths of first and second pad areas PAD1 and PAD2 W1 may be smaller than the width W2 of the first staircase part SP1 of the lower stack LS. For example, width W1 may be half of the width W2.

If the widths of the first and second pad areas PAD1 and PAD2 are narrow, then an open failure, in which the vertical via VIA11 is not coupled to a pad area, or a short failure, in which the vertical via VIA11 is coupled to at least two pad areas, may occur due to the lack of an alignment margin when the vertical via VIA11 is formed.

Embodiments of the disclosure illustrated in FIGS. 2 to 4 may overcome the above-described disadvantages of a memory device having the structure of FIG. 5. Referring again to FIGS. 2 to 4, according to embodiments of the disclosure, the second coupling part CP2 of the upper stack US overlaps with the first staircase part SP1 of the lower stack LS in the vertical direction, and the second staircase part SP2 of the upper stack US overlaps with the first coupling part CP1 of the lower stack LS in the vertical direction. The vertical vias VIA1 and VIA3, which couple the first word lines WL1 to the row decoder, pass through the first staircase part SP1 of the lower stack LS and the second coupling part CP2 of the upper stack US. The vertical vias VIA2 and VIA4, which couple the second word lines WL2 to the row decoder, pass through the first coupling part CP1 of the lower stack LS and the second staircase part SP2 of the upper stack US. Therefore, it is not necessary to form, in the lower stack LS and the upper stack US, a separate space or opening for disposing vertical vias, and it is not necessary to dispose the vertical vias only in a separately defined, limited space as seen in FIG. 5. Accordingly, it is possible to increase the number of vertical vias, which is advantageous for improving the degree of integration.

In addition, the first pad areas PAD1 may be configured to have a wider width, such as a width W3 of FIG. 4 of the second coupling part CP2 of the upper stack US, and the second pad areas PAD2 may be configured to have a wider width, such as the width W3 of the first coupling part CP1 of the lower stack LS in FIG. 4. Therefore, it is possible to contribute to preventing an open failure or a short failure that may occur when vertical vias are formed by increasing a margin for alignment when coupling vertical vias to the first and second pad areas PAD1 and PAD2.

FIGS. 6A to 13A are perspective views illustrating steps of a method for manufacturing a three-dimensional memory device in accordance with an embodiment of the disclosure. FIGS. 6B to 13B are cross-sectional views taken along lines A-A' of FIGS. 6A to 13A, respectively, and FIGS. 6C to 13C are cross-sectional views taken along lines B-B' of FIGS. 6A to 13A, respectively.

Figure 6A:
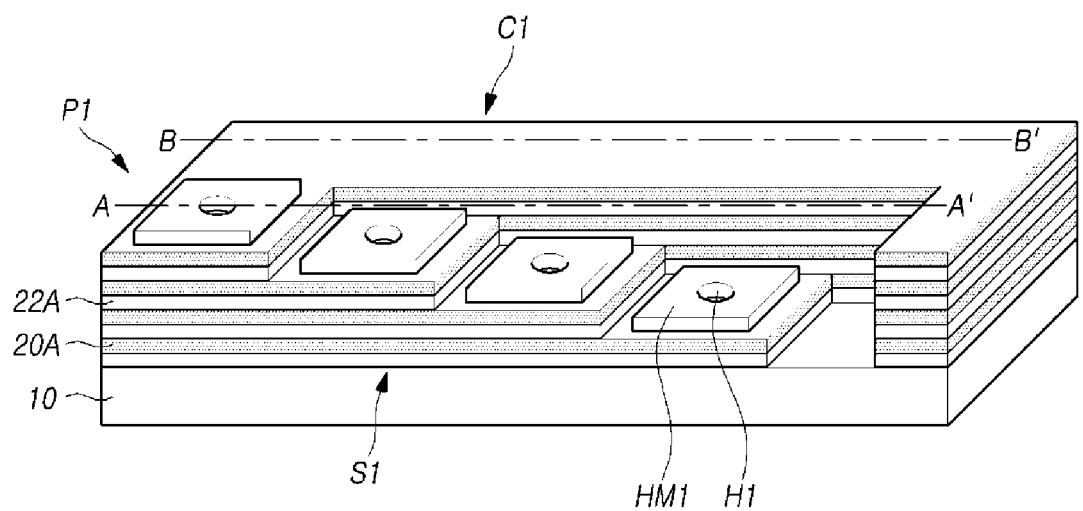
FIGS. 6A, 7A, 8A, 9A, 10A, 11A, 12A and 13A are perspective views illustrating steps of a method for manufacturing a three-dimensional memory device in accordance with an embodiment of the disclosure.
Figure 6B:
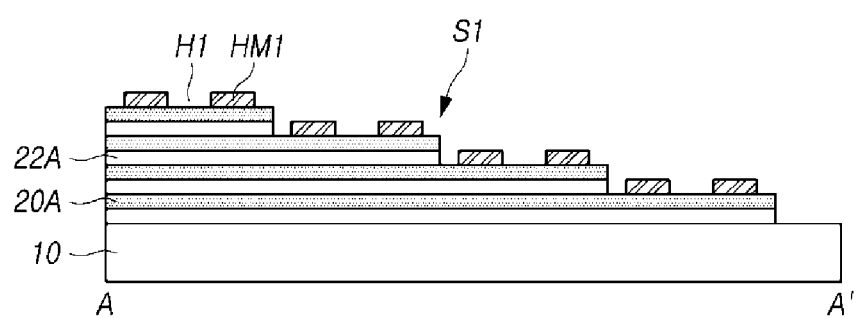
FIGS. 6B, 7B, 8B, 9B, 10B, 11B, 12B, and 13B are cross-sectional views taken along lines A-A' of FIGS. 6A, 7A, 8A, 9A, 10A, 11A, 12A, and 13A, respectively.
Figure 6C:
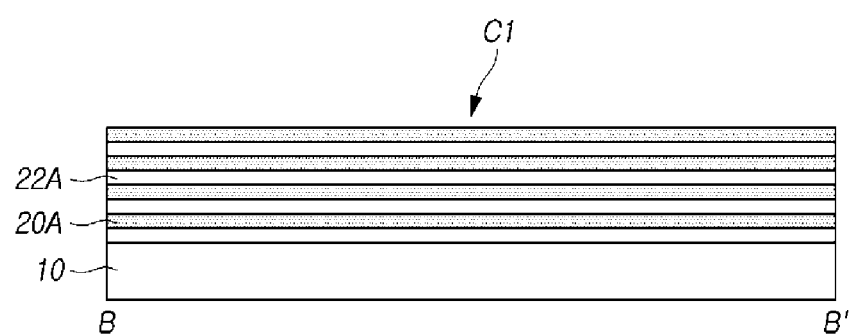
FIGS. 6C, 7C, 8C, 9C, 10C, 11C, 12C, AND 13C are cross-sectional views taken along lines B-B' of FIGS. 6A, 7A, 8A, 9A, 10A, 11A, 12A, and 13A, respectively.

Referring to FIGS. 6A to 6C, as a plurality of sacrificial layers 20A and a plurality of interlayer dielectric layers 22A are alternately stacked on a substrate 10, a first pre-stack P1 may be formed.

The plurality of sacrificial layers 20A and the plurality of interlayer dielectric layers 22A may be formed of different materials. The plurality of sacrificial layers 20A may be formed of a material that has an etching selectivity with respect to the plurality of interlayer dielectric layers 22A. For example, the plurality of interlayer dielectric layers 22A may be formed of an oxide, and the plurality of sacrificial layers 20A may be formed of a nitride.

As a partial width of the first pre-stack P1 is etched into a staircase shape, a staircase part S1, which exposes the plurality of sacrificial layers 20A in a staircase shape, and a coupling part C1, which is disposed parallel to the staircase part S1, may be formed.

First hard mask patterns HM1 each having a through hole H1 may be formed on exposed areas, respectively, of the sacrificial layers 20A that are positioned in the staircase part S1. The first hard mask patterns HM1 may be formed of a material that has an etching selectivity with respect to the plurality of sacrificial layers 20A and the plurality of interlayer dielectric layers 22A. The first hard mask patterns HM1 may be formed of a conductive material that has an etching selectivity with respect to the plurality of sacrificial layers 20A and the plurality of interlayer dielectric layers 22A.

Figure 7A:
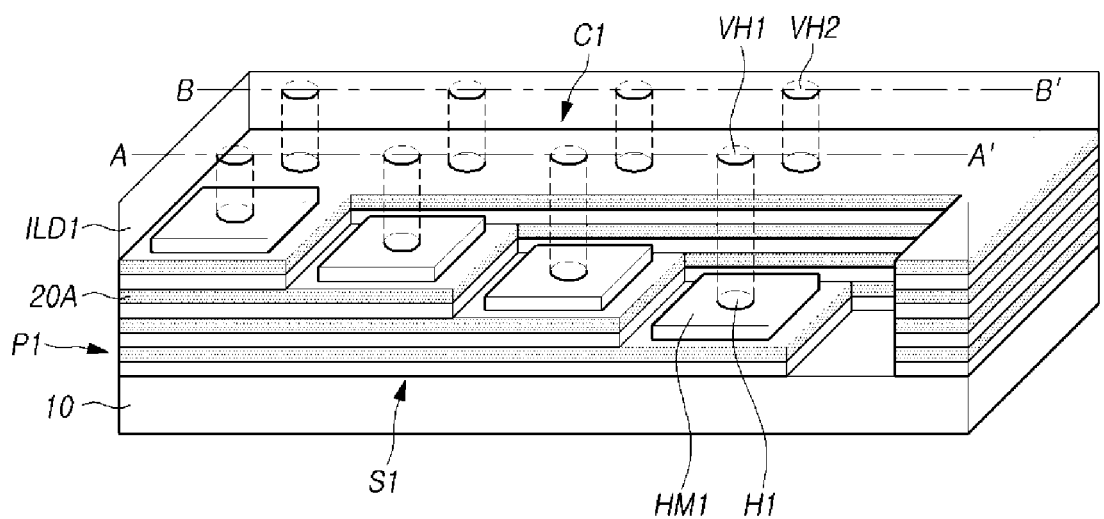
Figure 7B:
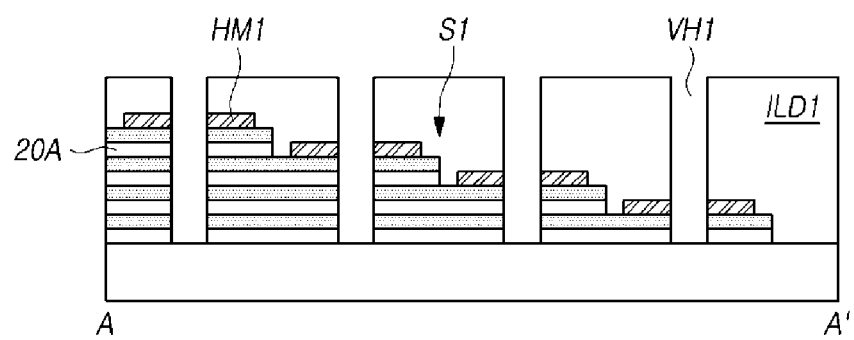
Figure 7C:
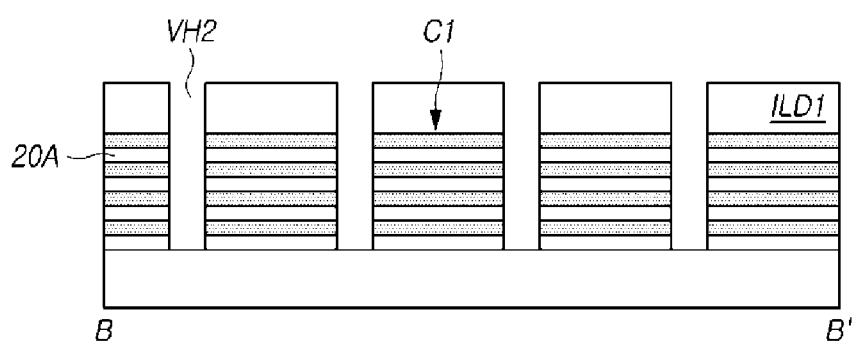

Referring to FIGS. 7A to 7C, a dielectric layer ILD1 may be formed on the first pre-stack P1 and the first hard mask patterns HM1. The dielectric layer ILD1 may be formed of a dielectric material that has an etching selectivity with respect to the sacrificial layers 20A. For example, if the sacrificial layers 20A are formed of a nitride, then the dielectric layer ILD1 may be formed of an oxide.

After a mask pattern (not illustrated) having a plurality of openings is formed on the dielectric layer ILD1, the dielectric layer ILD1 and the first pre-stack P1 are etched using the mask pattern as an etch mask. A plurality of first vertical holes VH1 are formed to pass through the staircase part S1 of the first pre-stack P1, and a plurality of second vertical holes VH2 are formed to pass through the coupling part C1 of the first pre-stack P1. Each of the plurality of first vertical holes VH1 may pass through and expose an area through a corresponding sacrificial layer 20A, and may communicate with the through hole H1 of the first hard mask pattern HM1, which is defined on the exposed area of the corresponding sacrificial layer 20A.

Figure 8A:
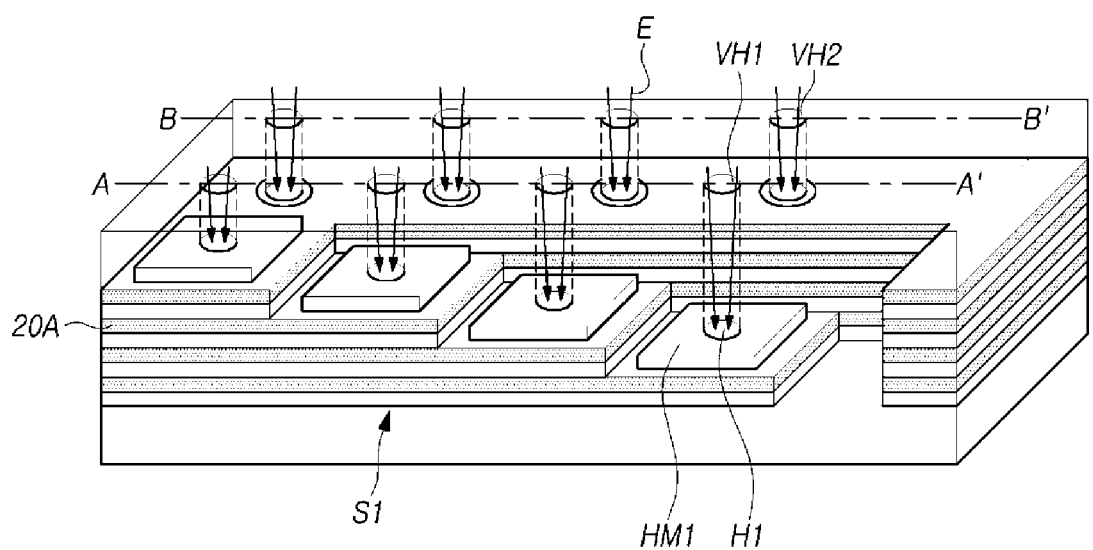
Figure 8B:
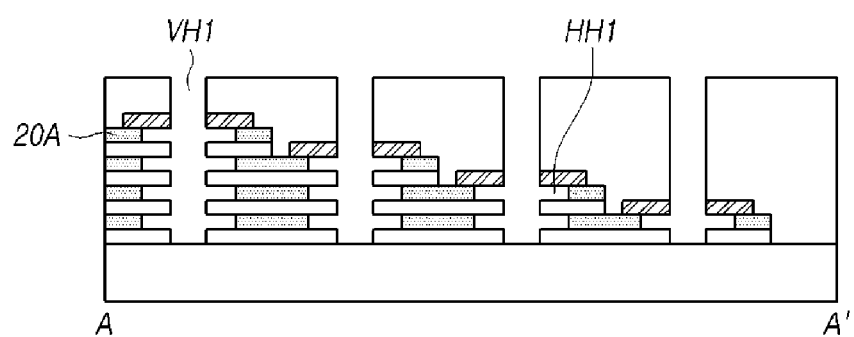
Figure 8C:
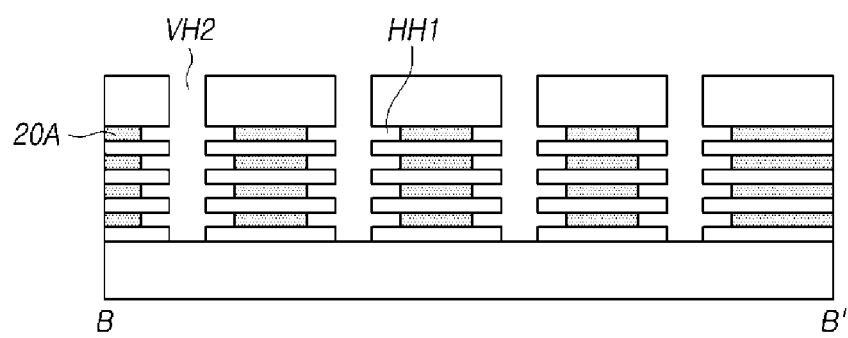

Referring to FIGS. 8A to 8C, an etchant E capable of removing the sacrificial layers 20A may be injected into the plurality of first vertical holes VH1 and the plurality of second vertical holes VH2. As portions of the sacrificial layers 20A around or common to the plurality of first vertical holes VH1 and the portions of sacrificial layers 20A around or common to the plurality of second vertical holes VH2 are removed by the etchant E, a plurality of horizontal grooves HH1 may be formed.

Figure 9A:
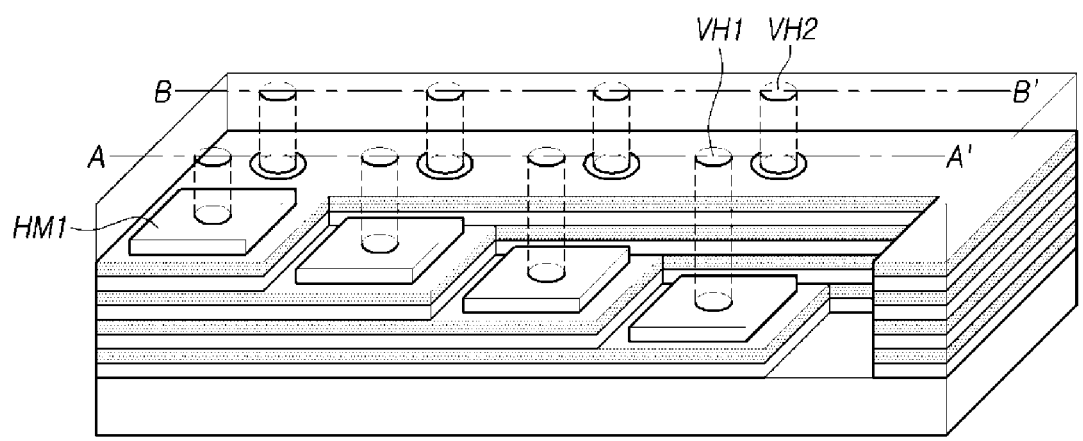
Figure 9B:
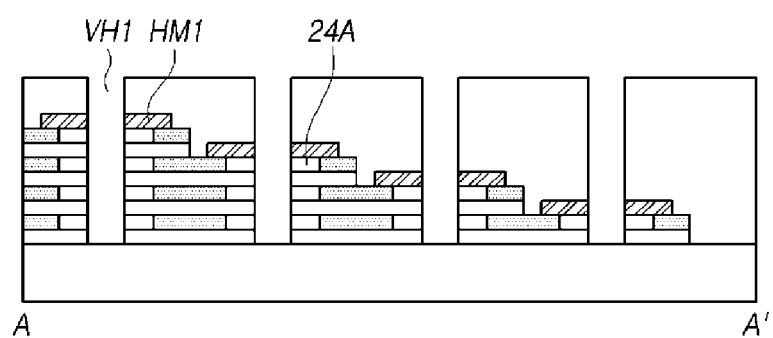
Figure 9C:
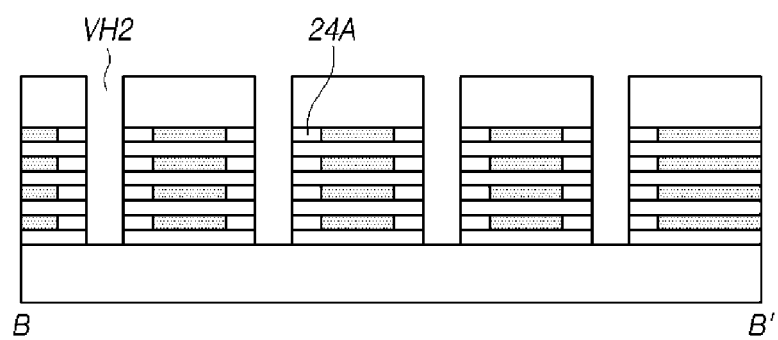

Referring to FIGS. 9A to 9C, dielectric patterns 24A may be formed to fill the plurality of horizontal grooves HH1. For example, by depositing a thin dielectric material on sidewalls of the plurality of first vertical holes VH1 and the plurality of second vertical holes VH2 such that the plurality of horizontal grooves HH1 are filled, the dielectric patterns 24A may be formed. In another example, the dielectric patterns 24A may be formed by using a dielectric material to fill the plurality of horizontal grooves HH1, the plurality of first vertical holes VH1 and the plurality of second vertical holes VH2, and then removing the dielectric material filled in the plurality of first vertical holes VH1 and the plurality of second vertical holes VH2 and leaving the dielectric material in the plurality of horizontal grooves HH1. The dielectric patterns 24A may be formed of an oxide.

Figure 10A:
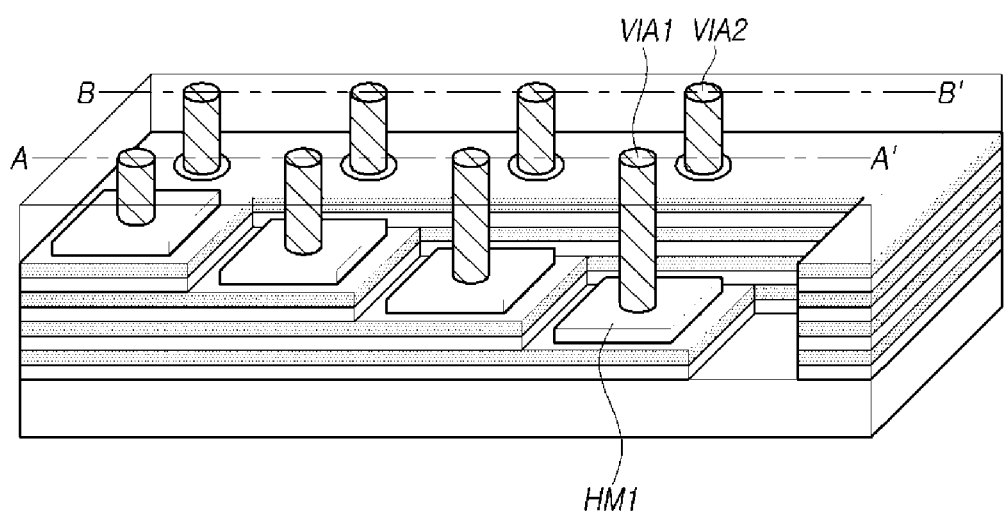
Figure 10B:
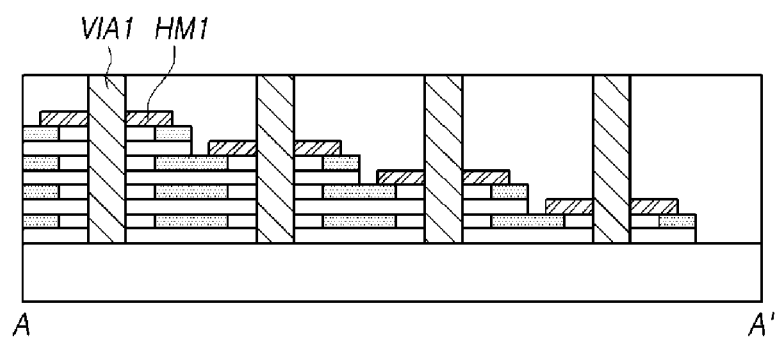
Figure 10C:
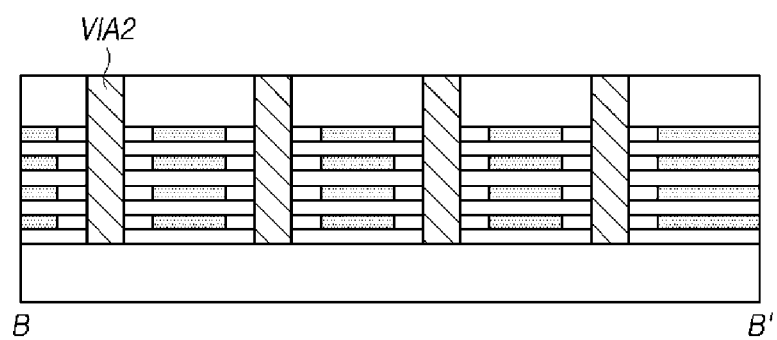

Referring to FIGS. 10A to 10C, a plurality of first vertical vias VIA1 and a plurality of second vertical vias VIA2 may be formed as the plurality of first vertical holes VH1 and the plurality of second vertical holes VH2 are filled with a conductive material. Each of the plurality of first vertical vias VIA1 may be coupled to a corresponding first hard mask pattern HM1.

Figure 11A:
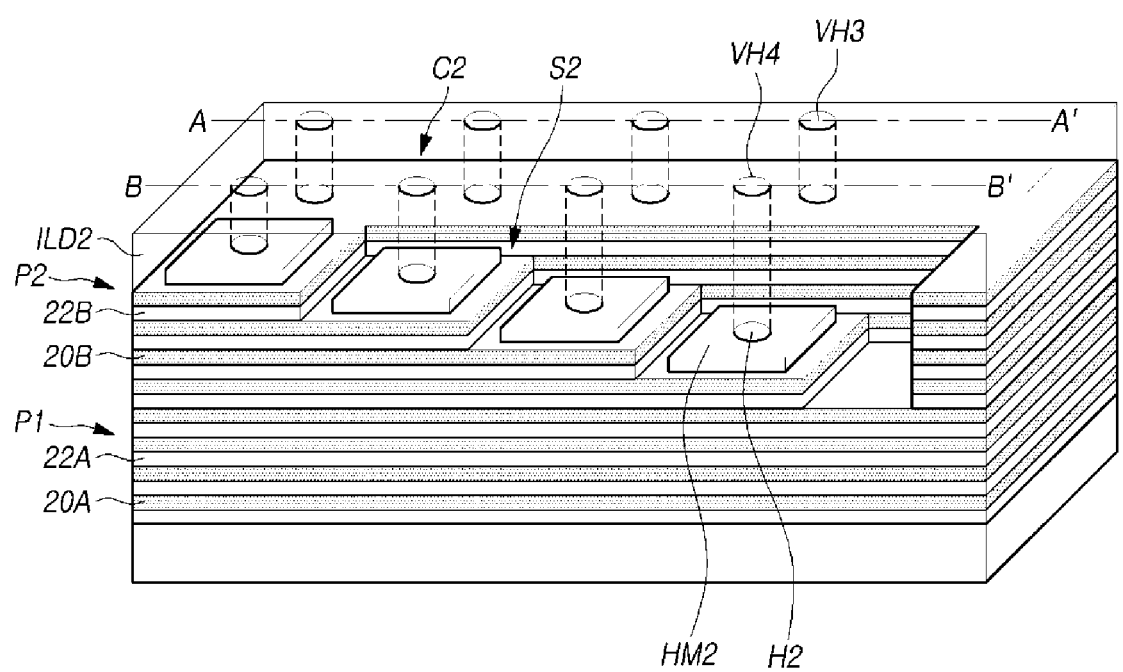
Figure 11B:
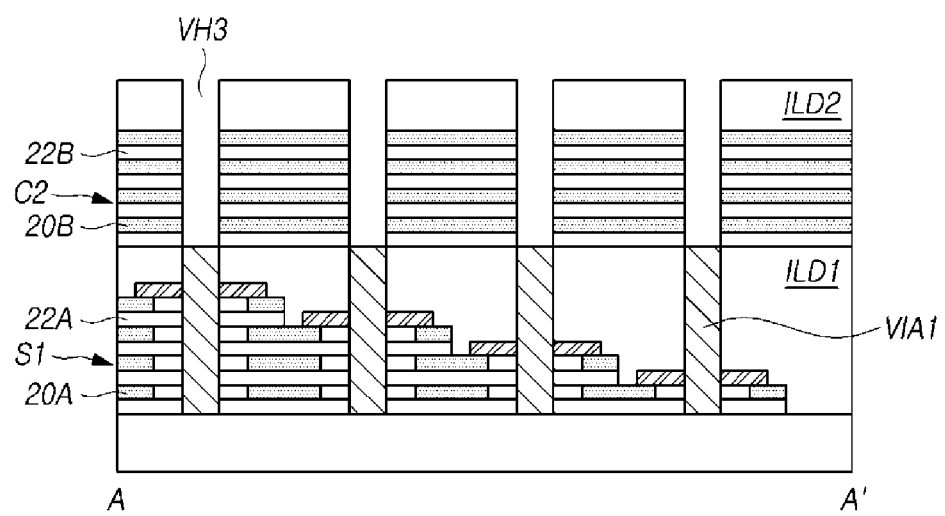
Figure 11C:
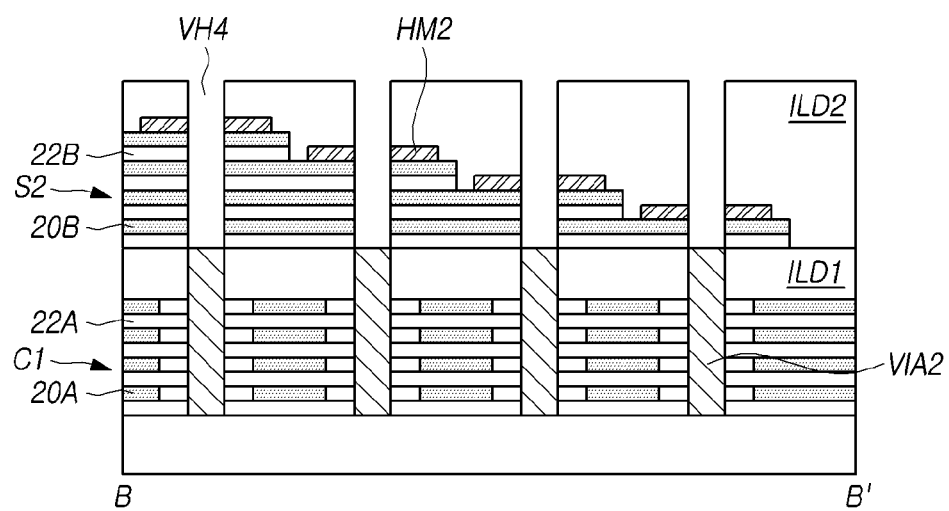

Referring to FIGS. 11A to 11C, as a plurality of sacrificial layers 20B and a plurality of interlayer dielectric layers 22B are alternately stacked on the dielectric layer ILD1, a second pre-stack P2 may be formed. The plurality of sacrificial layers 20B and the plurality of interlayer dielectric layers 22B may be formed of different materials. The plurality of sacrificial layers 20B may be formed of a material that has an etching selectivity with respect to the plurality of interlayer dielectric layers 22B. For example, the plurality of interlayer dielectric layers 22B may be formed of an oxide, and the plurality of sacrificial layers 20B may be formed of a nitride.

As a partial width of the second pre-stack P2 is etched into a staircase shape in a staircase part S2, which exposes the plurality of sacrificial layers 20B in a staircase shape, and a coupling part C2, which extends parallel to the staircase part S2, may be formed. The staircase part S2 of the second pre-stack P2 may overlap with the coupling part C1 of the first pre-stack P1 in the vertical direction, and the coupling part C2 of the second pre-stack P2 may overlap with the staircase part S1 of the first pre-stack P1 in the vertical direction.

Second hard mask patterns HM2 each having a through hole H2 may be formed on exposed areas, respectively, of the sacrificial layers 20B that are positioned in the step portions of the staircase part S2. The second hard mask patterns HM2 may be formed of a material that has an etching selectivity with respect to the plurality of sacrificial layers 20B and the plurality of interlayer dielectric layers 22B. For example, the second hard mask patterns HM2 may be formed of a conductive material that has an etching selectivity with respect to the plurality of sacrificial layers 20B and the plurality of interlayer dielectric layers 22B.

A dielectric layer ILD2 may be formed on the second pre-stack P2 and the second hard mask patterns HM2. The dielectric layer ILD2 may be formed of a dielectric material that has an etching selectivity with respect to the sacrificial layers 20B. For example, if the sacrificial layers 20B are formed of a nitride, then the dielectric layer ILD2 may be formed of an oxide.

After a mask pattern (not illustrated) having a plurality of openings is formed on the dielectric layer ILD2, the dielectric layer ILD2 and the second pre-stack P2 are etched using the mask pattern as an etch mask. A plurality of third vertical holes VH3 are formed to pass through the coupling part C2 of the second pre-stack P2 and to expose the plurality of first vertical vias VIA1, respectively, and a plurality of fourth vertical holes VH4 are formed to pass through the staircase part S2 of the second pre-stack P2 and to expose the plurality of second vertical vias VIA2, respectively. Each of the plurality of fourth vertical holes VH4 may pass through and expose an area common to a sacrificial layer 20B, and may communicate with the through hole H2 of the second hard mask pattern HM2, which is defined on the exposed area of the corresponding sacrificial layer 20B.

Figure 12A:
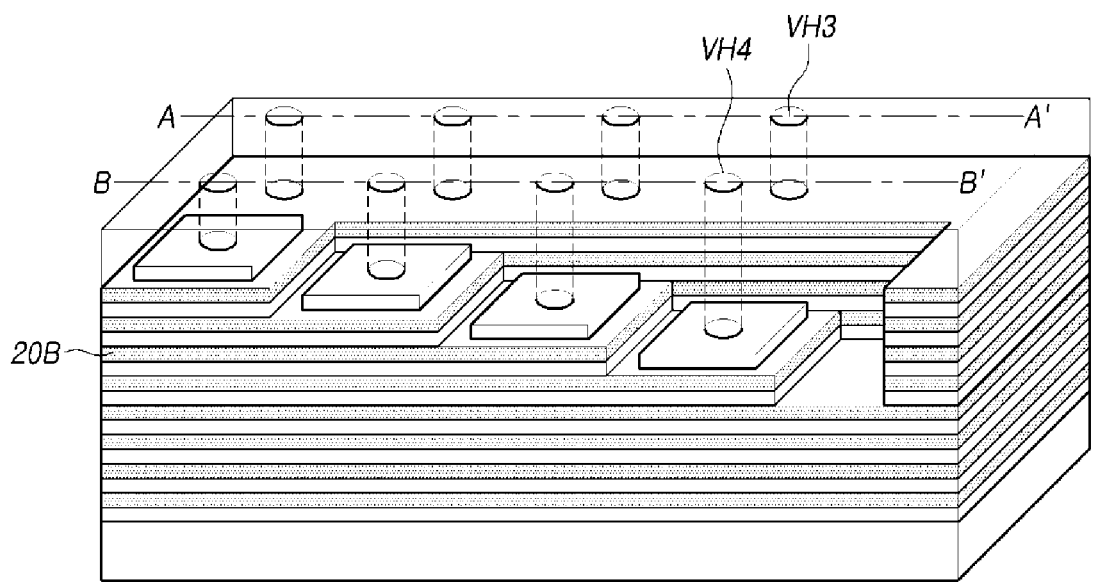
Figure 12B:
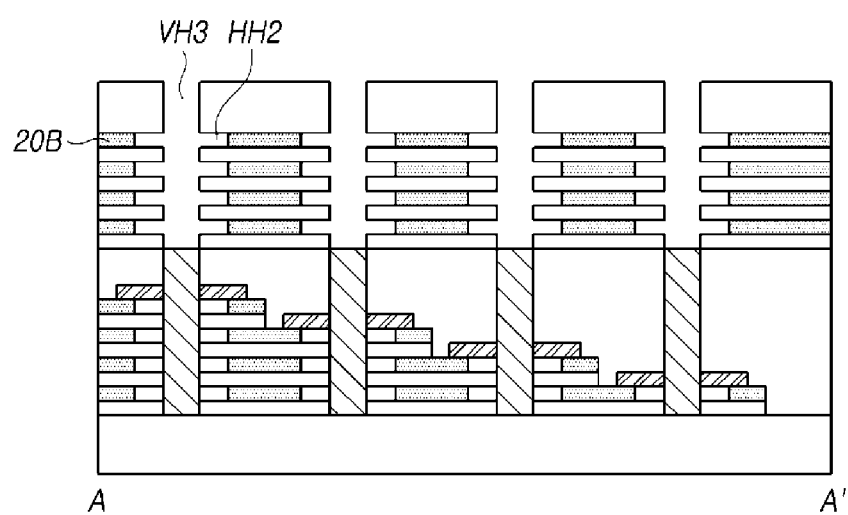
Figure 12C:
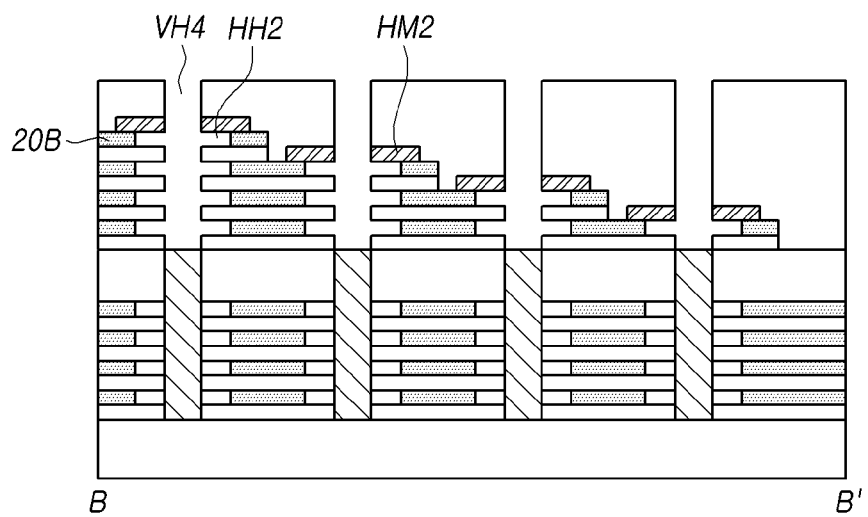

Referring to FIGS. 12A to 12C, an etchant capable of removing the sacrificial layers 20B may be injected into the plurality of third vertical holes VH3 and the plurality of fourth vertical holes VH4. As portions of the sacrificial layers 20B around or common to the plurality of third vertical holes VH3 and portions of the sacrificial layers 20B around or common to the plurality of fourth vertical holes VH4 are removed by the etchant, a plurality of horizontal grooves HH2 may be formed.

Figure 13A:
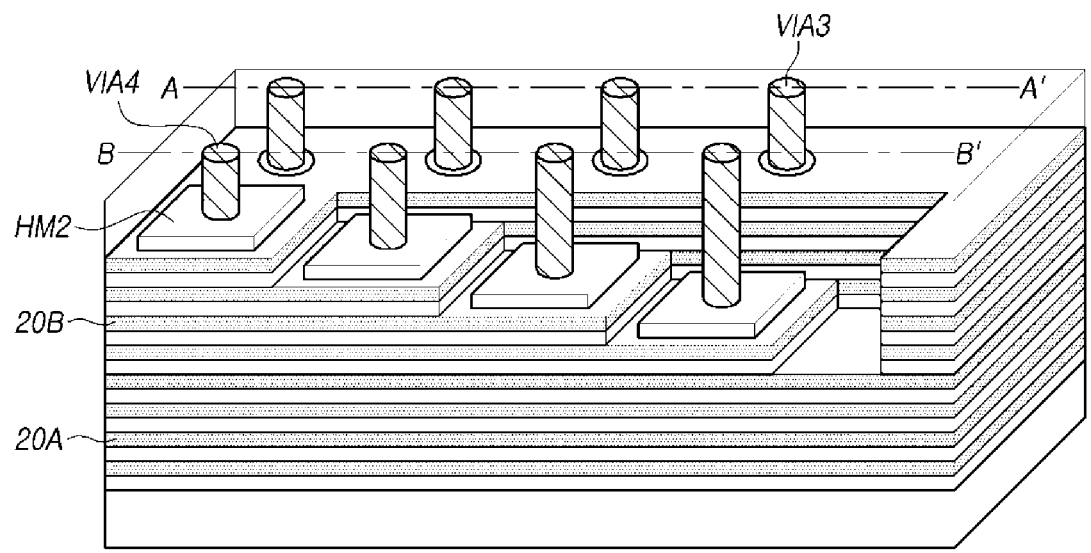
Figure 13B:
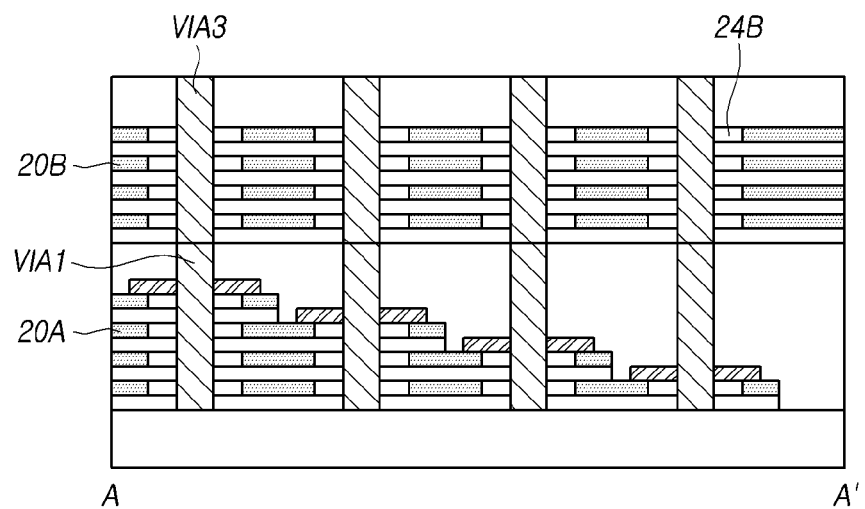
Figure 13C:
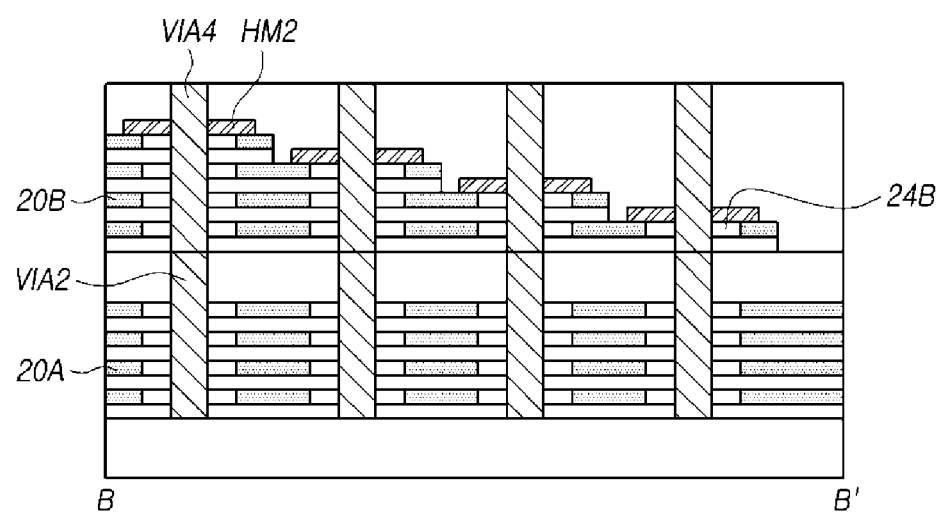

Referring to FIGS. 13A to 13C, dielectric patterns 24B may be formed to fill the plurality of horizontal grooves HH2. For example, by depositing a thin dielectric material on sidewalls of the plurality of third vertical holes VH3 and the plurality of fourth vertical holes VH4 such that the plurality of horizontal grooves HH2 are filled, the dielectric patterns 24B may be formed. In another example, the dielectric patterns 24B may be formed by using a dielectric material to fill the plurality of horizontal grooves HH2, the plurality of third vertical holes VH3 and the plurality of fourth vertical holes VH4, and then removing the dielectric material filled in the plurality of third vertical holes VH3 and the plurality of fourth vertical holes VH4 and leaving the dielectric material in the plurality of horizontal grooves HH2. The dielectric patterns 24B may be formed of an oxide.

As the plurality of third vertical holes VH3 and the plurality of fourth vertical holes VH4 are filled with a conductive material, a plurality of third vertical vias VIA3 and a plurality of fourth vertical vias VIA4 may be formed. The plurality of third vertical vias VIA3 are formed in the plurality of third vertical holes VH3, and may be coupled to the plurality of first vertical vias VIA1, respectively. The plurality of fourth vertical vias VIA4 are formed in the plurality of fourth vertical holes VH4, and may each be coupled to a corresponding second vertical via VIA2 and a corresponding second hard mask pattern HM2.

Remaining portions of the sacrificial layers 20A and 20B may be replaced with an electrode material to form first and second word lines (WL1 and WL2 of FIG. 3A).

Figure 14:
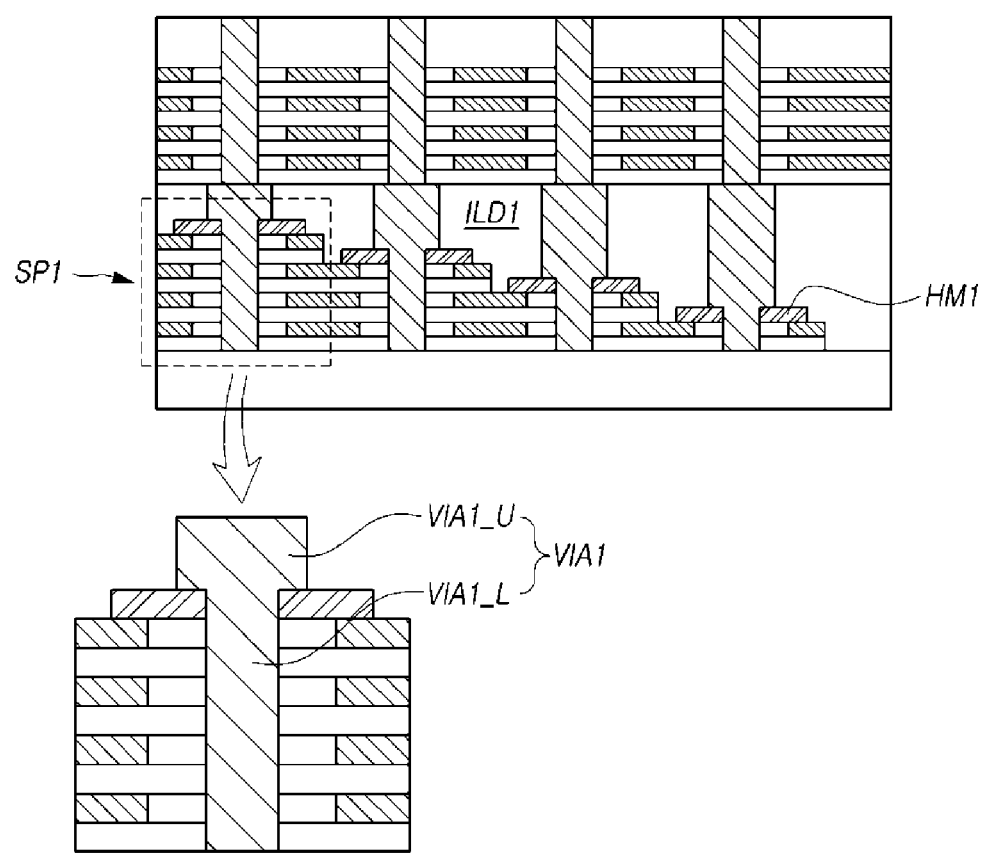
FIG. 14 is a cross-sectional view illustrating first vertical vias in accordance with another embodiment of the disclosure.

FIG. 14 is a cross-sectional view illustrating first vertical vias in accordance with another embodiment of the disclosure, and FIGS. 15A to 16B are cross-sectional views illustrating a method for forming the first vertical vias of FIG. 14.

Referring to FIG. 14, in a first staircase part SP1, an upper portion VIA1_U of a first vertical via VIA1, which passes through a dielectric layer ILD1, may have a larger width than a lower portion VIA1_L of the first vertical via VIA1 that passes through the stack in first staircase part SP1.

Figure 15A:
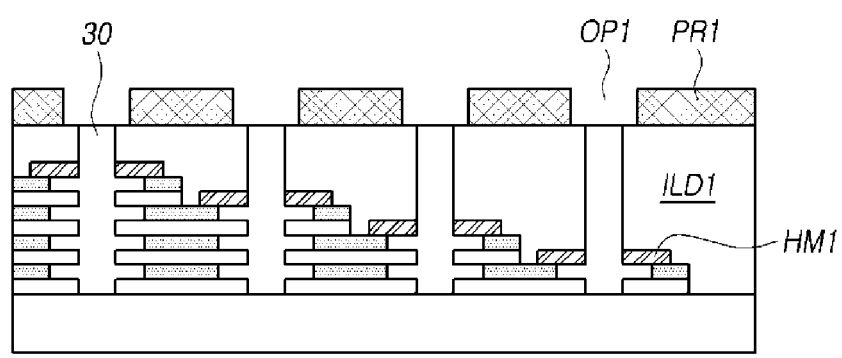
FIGS. 15A to 16B are views illustrating a method for forming the first vertical vias of FIG. 14.
Figure 15B:
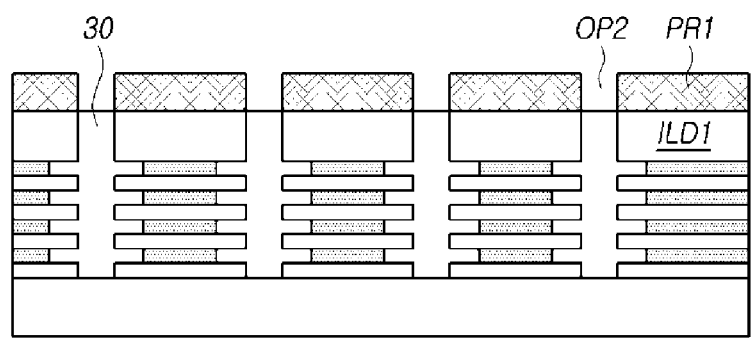

As described above, after a plurality of horizontal grooves (HH1 of FIGS. 8B and 8C) are formed through a process described with reference to FIGS. 8A to 8C, a dielectric material 30 may be used to fill the horizontal grooves (HH1 of FIGS. 8B and 8C), first vertical holes (VH1 of FIG. 8A) and second vertical holes (VH2 of FIG. 8A) as illustrated in FIGS. 15A and 15B.

A mask pattern PR1 may be formed on the dielectric layer ILD1. In FIG. 15A, the mask pattern PR1 may have a plurality of first openings OP1, which expose the dielectric material 30 and a portion of the dielectric layer ILD1 around the first vertical holes (VH1 of FIG. 8A). In FIG. 15B, the mask pattern PR1 may also have a plurality of second openings OP2, which expose the dielectric material 30 filled in the second vertical holes (VH2 of FIG. 8A).

Figure 16A:
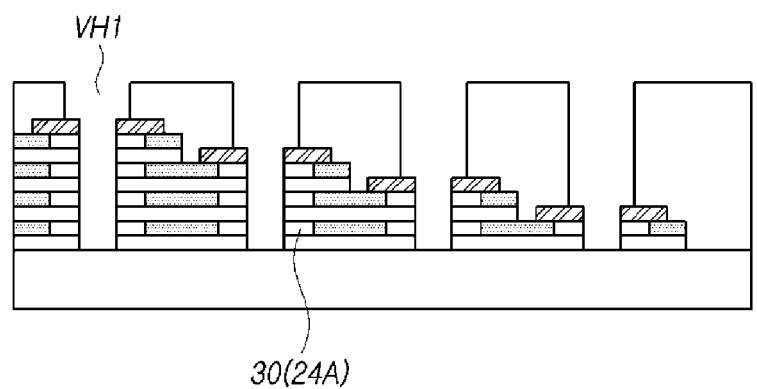
Figure 16B:
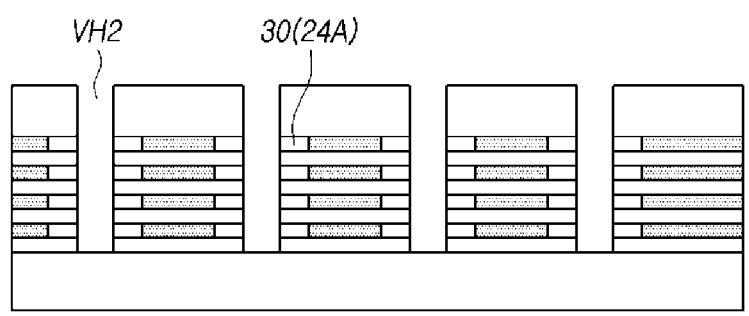

As the dielectric layer ILD1 and the dielectric material 30 are etched using the mask pattern PR1 and the first hard mask patterns HM1 as an etch mask, as illustrated in FIGS. 16A and 16B, the dielectric material 30 common to the first vertical holes VH1 and second vertical holes VH2 may be removed, while dielectric patterns 24A may be formed from the dielectric material 30 remaining in the horizontal grooves (HH1 of FIGS. 8B and 8C).

Because the first opening OP1 of the mask pattern PR1 exposes not only the dielectric material 30 filled in the first vertical hole (VH1 of FIG. 8A), but also the dielectric layer ILD1 around the first vertical hole (VH1 of FIG. 8A), an upper portion of the first vertical hole VH1 may have a width wider than that of a lower portion.

The mask pattern PR1 may be formed using a photoresist. The mask pattern PR1 remaining after the dielectric material 30 and the dielectric layer ILD1 are etched may be removed through a strip process.

Thereafter, as the plurality of first vertical holes VH1 and the plurality of second vertical holes VH2 are filled with a conductive material, a plurality of first vertical vias VIA1 (see FIG. 14) and a plurality of second vertical vias may be formed.

Figure 17A:
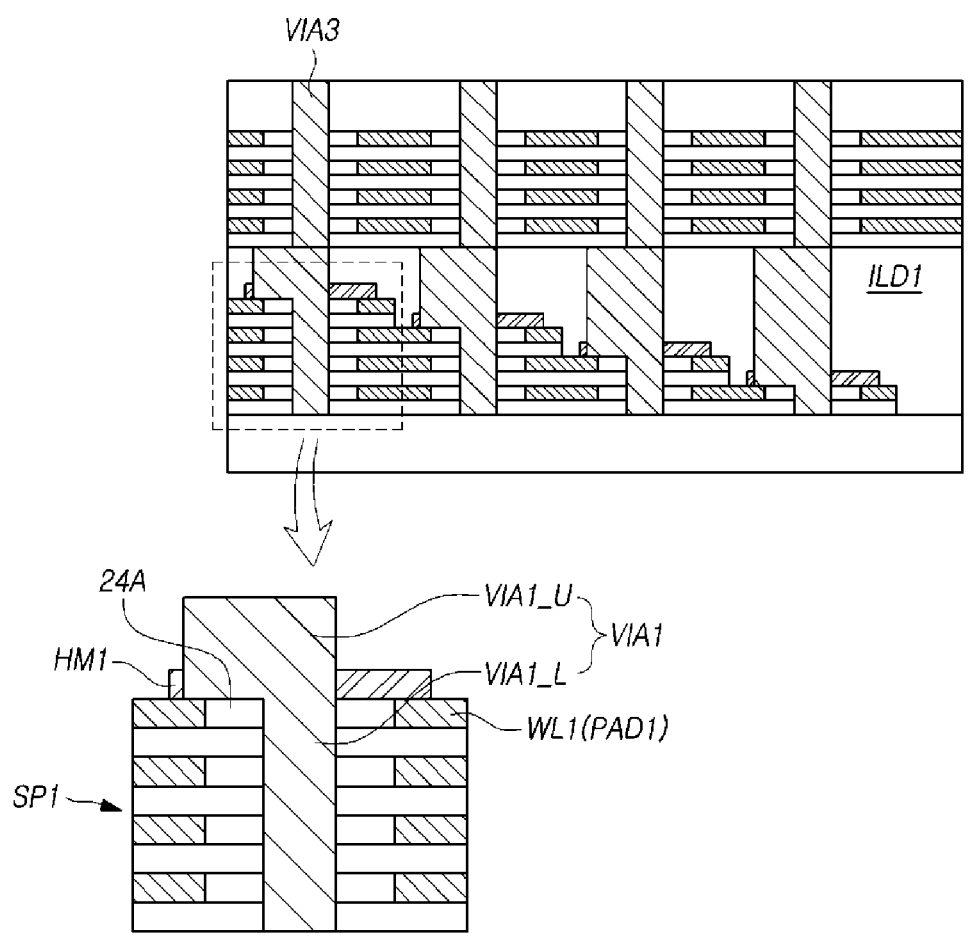
FIGS. 17A and 17B are cross-sectional views illustrating first vertical vias and fourth vertical vias in accordance with a further embodiment of the disclosure.
Figure 17B:
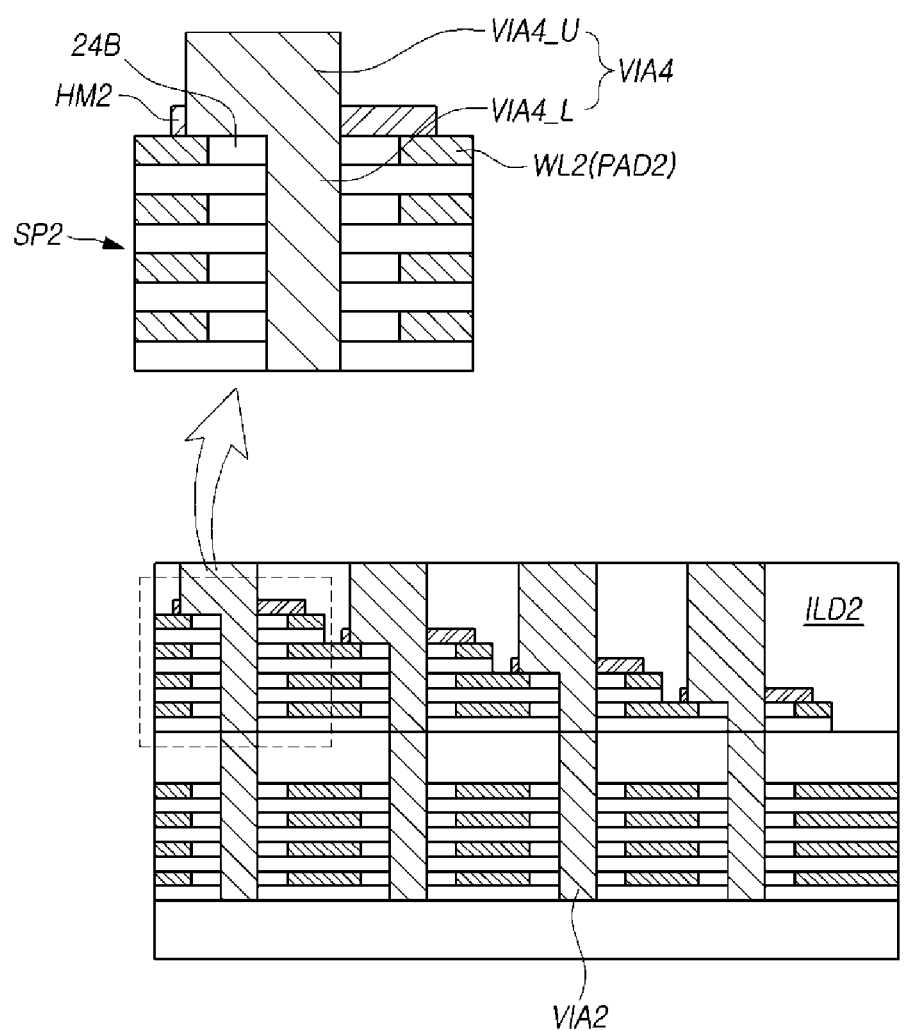

FIGS. 17A and 17B are cross-sectional views illustrating first vertical vias and fourth vertical vias in accordance with a further embodiment of the disclosure. FIGS. 18A to 21B are cross-sectional views illustrating a method for forming the first vertical vias and the fourth vertical vias illustrated in FIGS. 17A and 17B.

Referring to FIG. 17A, a lower portion VIA1_L of a first vertical via VIA1 may be positioned in a first staircase part SP1, and may be isolated from first word lines WL1 by dielectric patterns 24A.

An upper portion VIA1_U of the first vertical via VIA1 may pass through a dielectric layer ILD1 and a portion of first hard mask pattern HM1 common to a pad area, and thereby, may be directly coupled to a first pad area PAD1 of a corresponding first word line WL1. In this embodiment, the first hard mask pattern HM1 may be a conductive material or may be an insulating material.

Referring to FIG. 17B, a lower portion VIA4_L of a fourth vertical via VIA4 may be positioned in a second staircase part SP2, and may be isolated from second word lines WL2 by dielectric patterns 24B. An upper portion VIA4_U of the fourth vertical via VIA4 may pass through a dielectric layer ILD2 and a portion of second hard mask pattern HM2 common to a pad area, and thereby, may be directly coupled to a second pad area PAD2 of a corresponding second word line WL2. In this embodiment, the second hard mask pattern HM2 may be a conductive material or may be an insulating material.

Figure 18A:
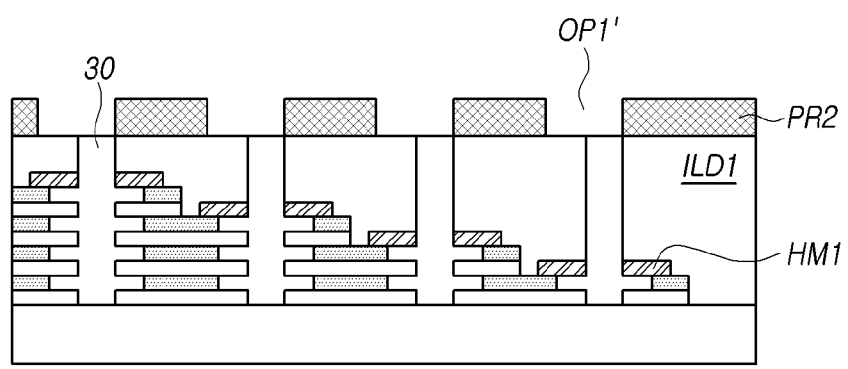
FIGS. 18A to 21B are cross-sectional views illustrating a method for forming the first vertical vias and the fourth vertical vias illustrated in FIGS. 17A and 17B.
Figure 18B:
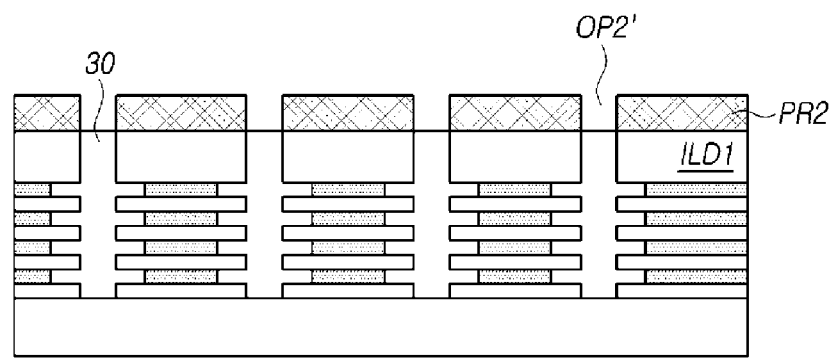

As described above, after a plurality of horizontal grooves (HH1 of FIGS. 8B and 8C) are formed through a process described with reference to FIGS. 8A to 8C, a dielectric material 30 may be used to fill the horizontal grooves (HH1 of FIGS. 8B and 8C), first vertical holes (VH1 of FIG. 8A) and second vertical holes (VH2 of FIG. 8A) as illustrated in FIGS. 18A and 18B.

A mask pattern PR2 may be formed on the dielectric layer ILD1. The mask pattern PR2 may have a plurality of first openings OP1', which expose the dielectric material 30 and a portion of the dielectric layer ILD1 around the first vertical holes (VH1 of FIG. 8A). The mask pattern PR2 may also have and a plurality of second openings OP2', which expose the dielectric material 30 filled in the second vertical holes (VH2 of FIG. 8A).

Figure 19A:
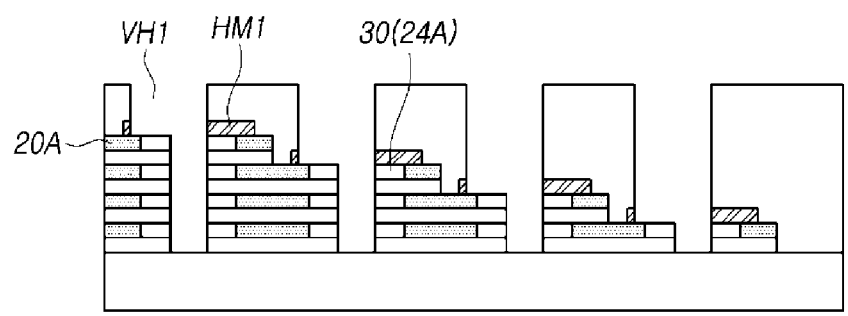
Figure 19B:
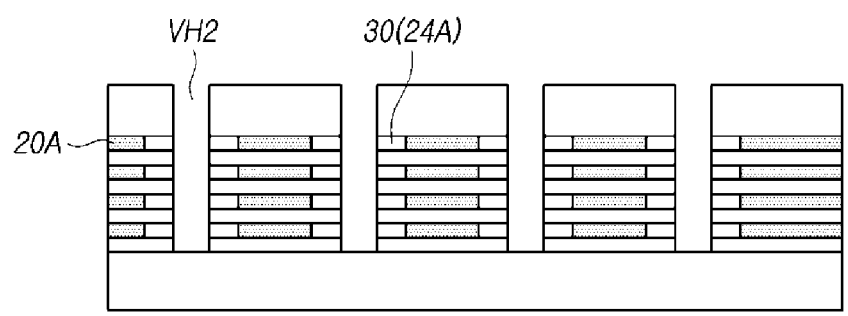

Using the mask pattern PR2 and the first hard mask patterns HM1 as an etch mask, the dielectric layer ILD1 and the dielectric material 30 may be etched. Accordingly, as illustrated in FIGS. 19A and 19B, the dielectric material 30 common to the first vertical holes VH1 and second vertical holes VH2 may be removed, while dielectric patterns 24A may be formed from the dielectric material 30 remaining in the horizontal grooves (HH1 of FIGS. 8B and 8C).

As the first hard mask patterns HM1 in the first vertical holes VH1 are etched, portions of sacrificial layers 20A immediately under the first hard mask patterns HM1 may be exposed. The mask pattern PR2 may be formed using a photoresist. The remaining mask pattern PR2 may be removed through a strip process.

Thereafter, as the plurality of first vertical holes VH1 and the plurality of second vertical holes VH2 are filled with a conductive material, a plurality of first vertical vias VIA1 (see FIG. 17A) and a plurality of second vertical vias VIA2 (see FIG. 17B) may be formed.

Figure 20A:
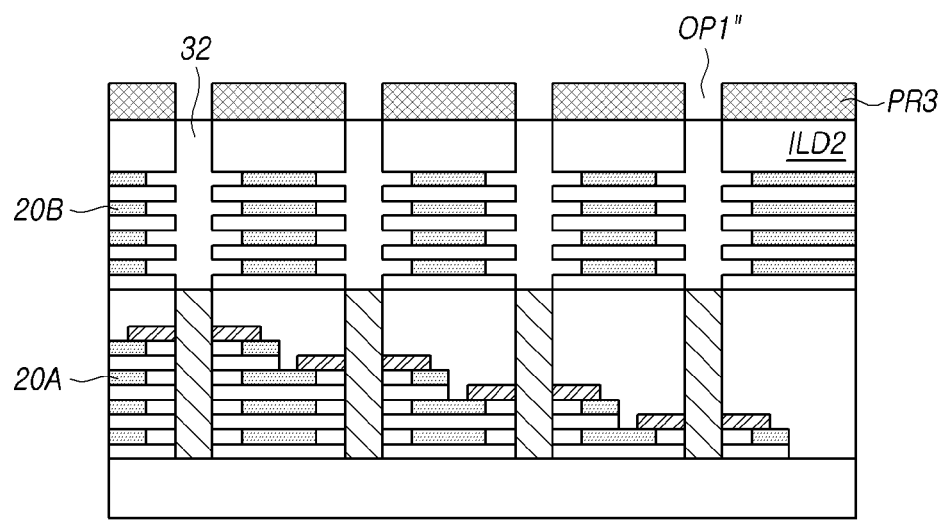
Figure 20B:
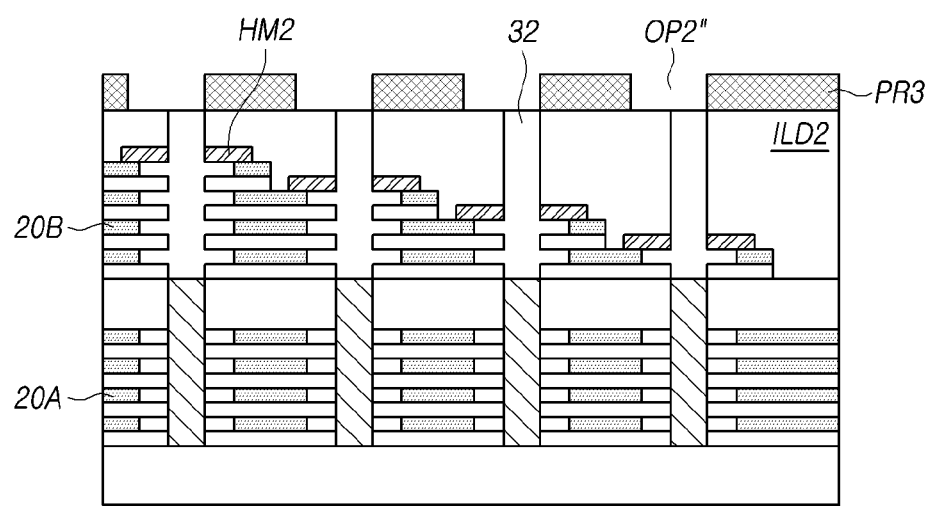

As described above, after a plurality of horizontal grooves (HH2 of FIGS. 12B and 12C) are formed through a process described above with reference to FIGS. 12A to 12C, a dielectric material 32 may fill the horizontal grooves (HH2 of FIGS. 12B and 12C), third vertical holes (VH3 of FIG. 12A) and fourth vertical holes (VH4 of FIG. 12A) as seen in FIGS. 20A and 20B.

A mask pattern PR3 may be formed on the dielectric layer ILD2. The mask pattern PR3 may have a plurality of first openings OP1", which expose the dielectric material 32 and a portion of the dielectric layer ILD2 around the third vertical holes (VH3 of FIG. 12A). The mask pattern PR3 may also have plurality of second openings OP2", which expose the dielectric material 32 and a portion of the dielectric layer ILD2 around the fourth vertical holes (VH4 of FIG. 12A).

Figure 21A:
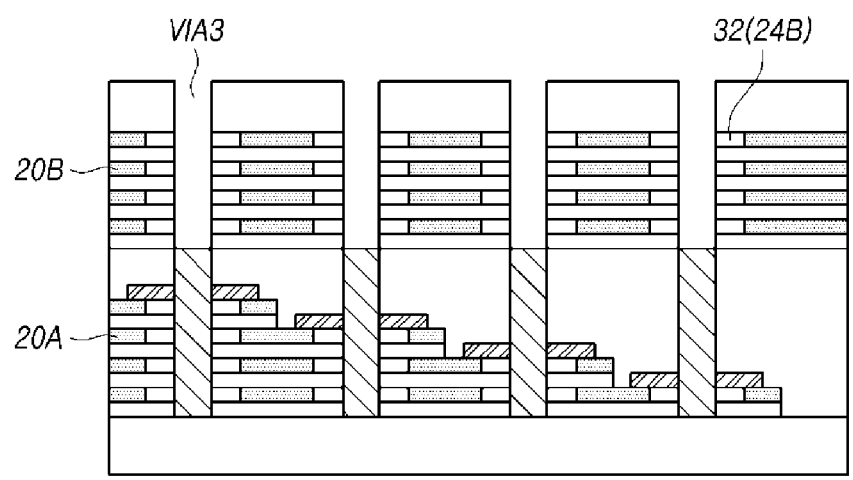
Figure 21B:
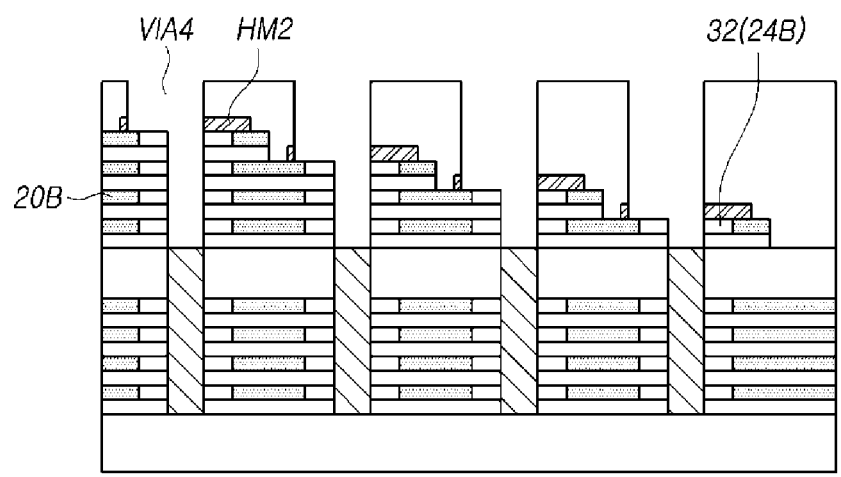

Using the mask pattern PR3 and the second hard mask patterns HM2 as an etch mask, the dielectric layer ILD2 and the dielectric material 32 may be etched. Accordingly, as illustrated in FIGS. 21A and 21B, the dielectric material 32 common to the third vertical holes VH3 and fourth vertical holes VH4 may be removed, while dielectric patterns 24B may be formed from the dielectric material 32 remaining in the horizontal grooves (HH2 of FIGS. 12B and 12C).

As the second hard mask patterns HM2 in the fourth vertical holes VH4 are etched, portions of sacrificial layers 20B immediately under the second hard mask patterns HM2 may be exposed. The mask pattern PR3 may be formed using a photoresist. The remaining mask pattern PR3 may be removed through a strip process.

Thereafter, as the plurality of third vertical holes VH3 and the plurality of fourth vertical holes VH4 are filled with a conductive material, a plurality of third vertical vias VIA3 (see FIG. 17A) and a plurality of fourth vertical vias VIA4 (see FIG. 17B) may be formed.

Figure 22A:
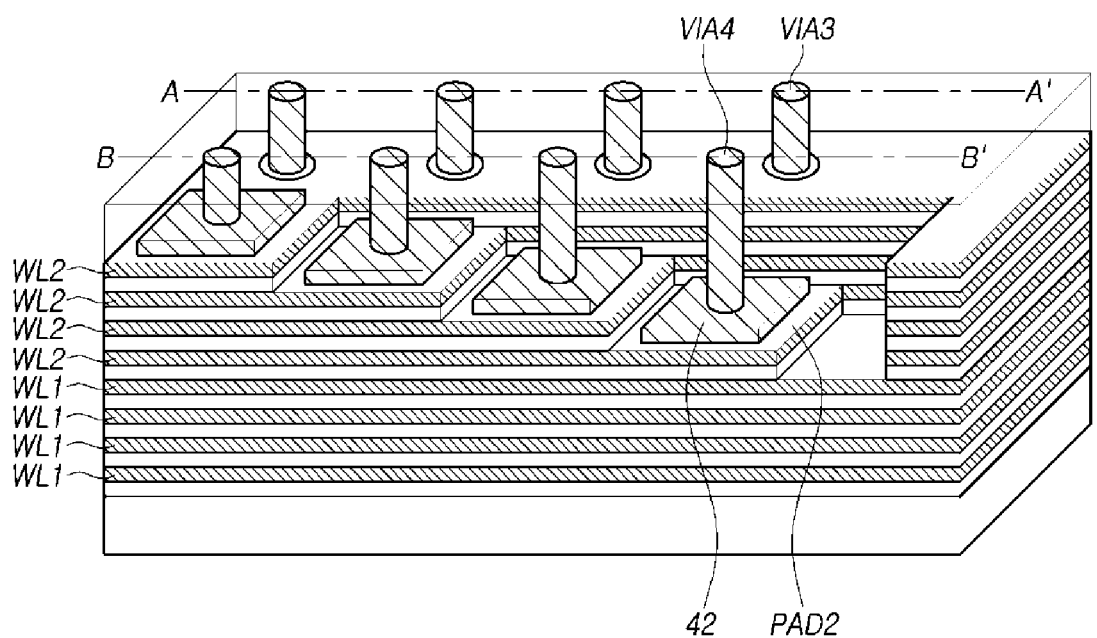
FIGS. 22A to 22C are views illustrating first vertical vias and fourth vertical vias in accordance with yet another embodiment of the disclosure.
Figure 22B:
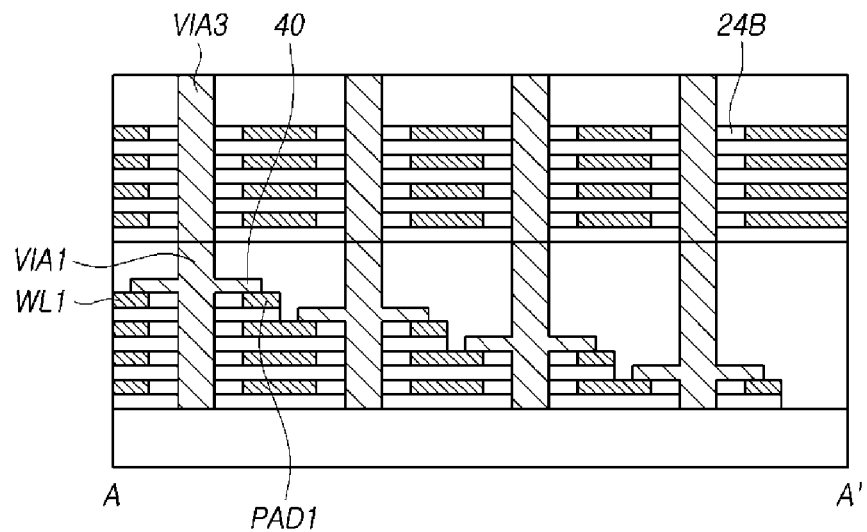
Figure 22C:
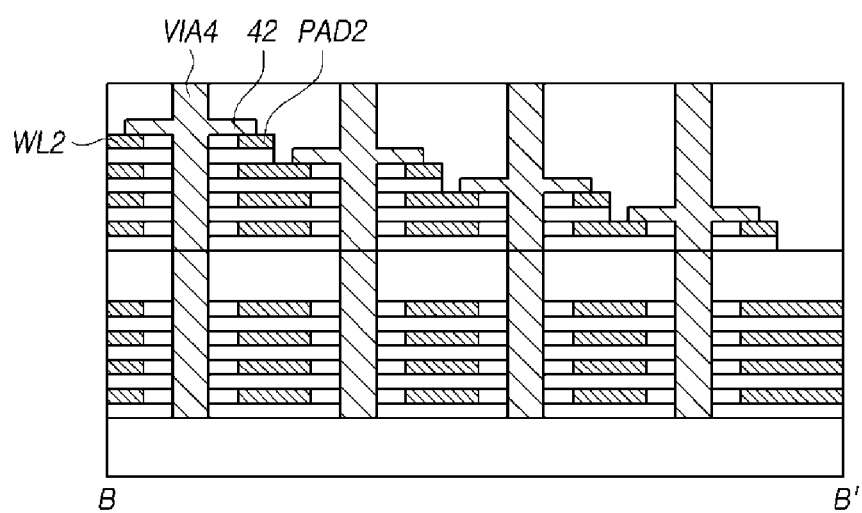

FIGS. 22A to 22C are views illustrating first vertical vias and fourth vertical vias in accordance with yet another embodiment of the disclosure. In detail, FIG. 22A is a perspective view, FIG. 22B is a cross-sectional view taken along a line A-A' of FIG. 22A, and FIG. 22C is a cross-sectional view taken along a line B-B' of FIG. 22A.

Referring to FIGS. 22A to 22C, each of first vertical vias VIA1 may include a conductive pad portion 40, which is disposed on a first pad area PAD1 of a corresponding first word line WL1 and is directly coupled to the first pad area PAD1. The conductive pad portion 40 may have a flat plate shape that covers an upper surface of the first pad area PAD1 of the corresponding first word line WL1.

Each of fourth vertical vias VIA4 may include a conductive pad portion 42 that is disposed on a second pad area PAD2 of a corresponding second word line WL2 and is directly coupled to the second pad area PAD2. The conductive pad portion 42 may have a flat plate shape that covers an upper surface of the second pad area PAD2 of the corresponding second word line WL2.

As previously described, after the step of forming the dielectric patterns 24A described above with reference to FIGS. 9A to 9C, a process of removing first hard mask patterns (HM1 of FIG. 9A) may be additionally performed. In the case of the present embodiment, the first hard mask patterns may be made of a conductive material or a dielectric material.

Thereafter, in the process of filling first vertical holes (VH1 of FIG. 9A) and second vertical holes (VH2 of FIG. 9A) with a conductive material described above with reference to FIGS. 10A to 10C, spaces from which the first hard mask patterns are removed may be filled with the conductive material. The conductive material filling in the spaces where the first hard mask patterns are removed may form conductive pad portions 40 (see FIG. 22B) of the first vertical vias VIA1.

As previously described, after the step of forming the dielectric patterns 24B described above with reference to FIGS. 13A to 13C, a process of removing second hard mask patterns (HM2 of FIG. 13A) may be additionally performed. In the process of filling third vertical holes (VH3) and fourth vertical holes (VH4) with a conductive material, spaces from which the second hard mask patterns are removed may be filled with the conductive material. The conductive material filling in the spaces from which the second hard mask patterns are removed may form conductive pad portions 42 (see FIGS. 22A and 22C) of the fourth vertical vias VIA4.

Figure 23:
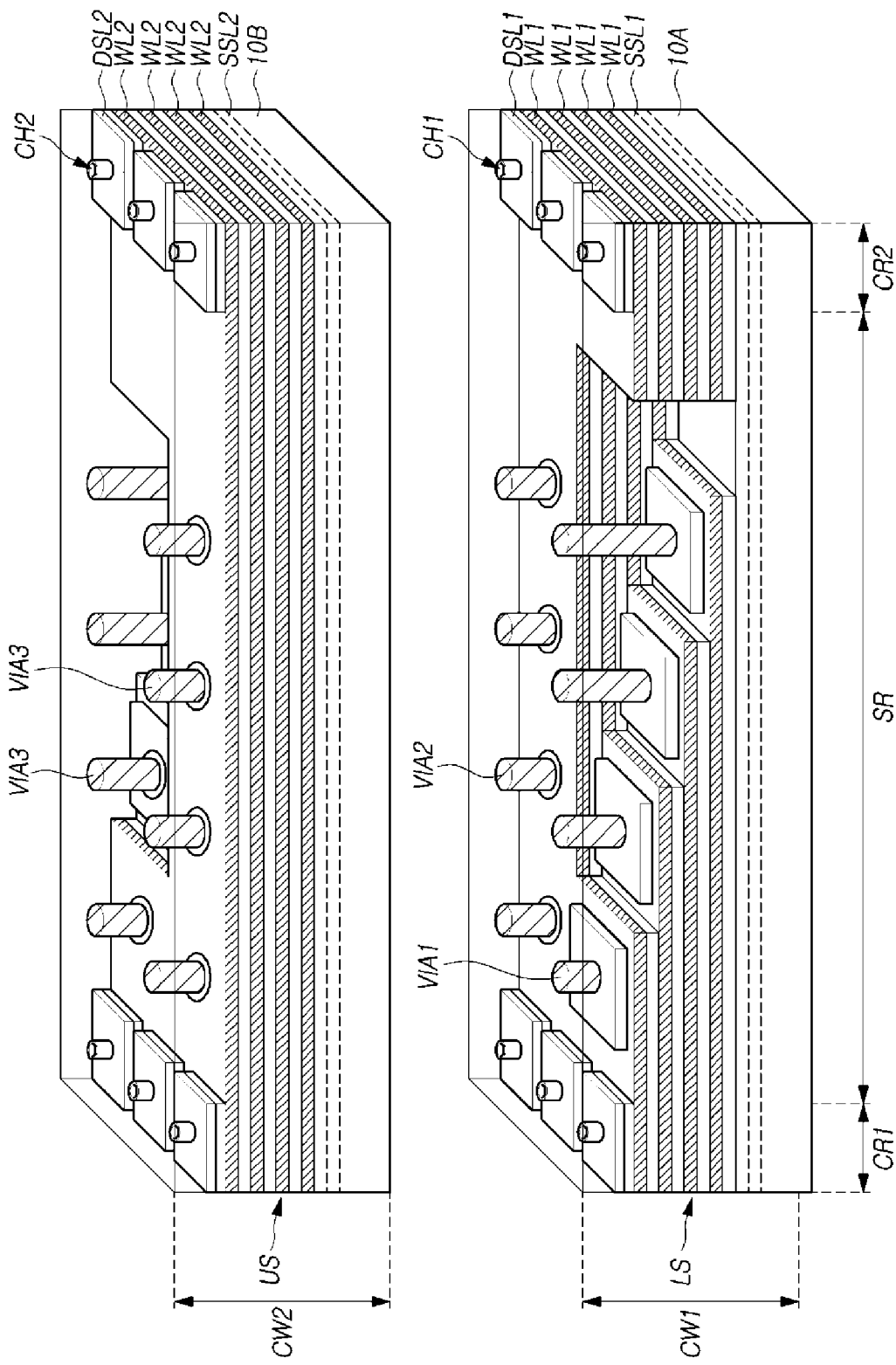
FIG. 23 is a view illustrating a three-dimensional memory device in accordance with still another embodiment of the disclosure.

FIG. 23 is a view illustrating a three-dimensional memory device in accordance with still another embodiment of the disclosure.

Referring to FIG. 23, a lower stack LS may be configured in a first cell wafer CW1, and an upper stack US may be configured in a second cell wafer CW2, which is disposed on the first cell wafer CW1.

The lower stack LS may include a plurality of first word lines WL1, which are stacked on a substrate 10A of the first cell wafer CW1, and the upper stack US may include a plurality of second word lines WL2, which are stacked on a substrate 10B of the second cell wafer CW2.

The lower stack LS may further include a first source select line SSL1, which is disposed under the plurality of first word lines WL1, and a first drain select line DSL1, which is disposed on the plurality of first word lines WL1. The upper stack US may further include a second source select line SSL2, which is disposed under the plurality of second word lines WL2, and a second drain select line DSL2, which is disposed on the plurality of second word lines WL2.

A plurality of first vertical channels CH1, which pass through the lower stack LS and are coupled to the substrate 10A, may be defined in a first cell region CR1 and a second cell region CR2. A plurality of second vertical channels CH2, which pass through the upper stack US and are coupled to the substrate 10B, may be defined in the first cell region CR1 and the second cell region CR2. The first cell wafer CW1 and the second cell wafer CW2 may be bonded to each other by a bonding technique, for example, by hybrid bonding.

Although not illustrated, the substrate 10B of the second cell wafer CW2 may include a plurality of through vias for electrically coupling a plurality of first vertical vias VIA1 to a plurality of third vertical vias VIA3, and a plurality of through vias for electrically coupling a plurality of second vertical vias VIA2 to a plurality of fourth vertical vias VIA4. A logic wafer including a row decoder may be bonded to the bottom of the first cell wafer CW1 or to the top of the second cell wafer CW2.

Figure 24:
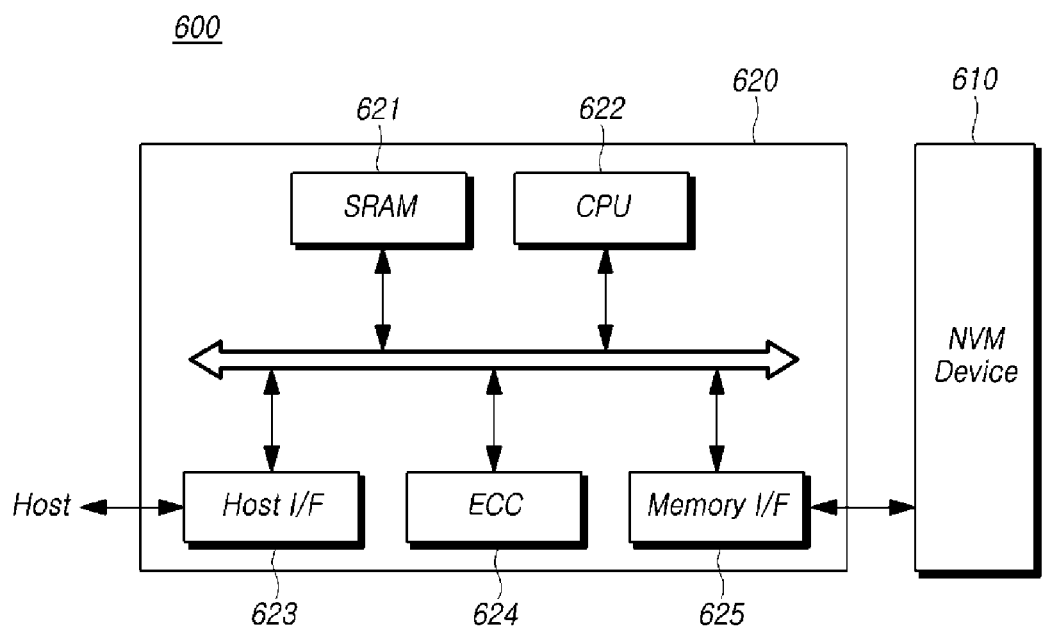
FIG. 24 is a block diagram schematically illustrating a memory system including a three-dimensional memory device in accordance with an embodiment of the disclosure.

FIG. 24 is a block diagram schematically illustrating a memory system including a three-dimensional memory device in accordance with an embodiment of the disclosure.

Referring to FIG. 24, a memory system 600 in accordance with an embodiment may include a nonvolatile memory device (NVM Device) 610 and a memory controller 620.

The nonvolatile memory device (NVM Device) 610 may be constituted by a three-dimensional memory device described above and may operate in the manner described above. The memory controller 620 may be configured to control the nonvolatile memory device (NVM Device) 610. By the combination of the nonvolatile memory device (NVM Device) 610 and the memory controller 620, a memory card or a solid state disk (SSD) may be provided. An SRAM 621 is used as a working memory of a processing unit (CPU) 622. A host interface (Host I/F) 623 includes a data exchange protocol of a host, which is coupled with the memory system 600.

An error correction code block (ECC) 624 detects and corrects an error included in data read from the nonvolatile memory device (NVM Device) 610.

A memory interface (Memory I/F) 625 interfaces with the nonvolatile memory device (NVM Device) 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 25:
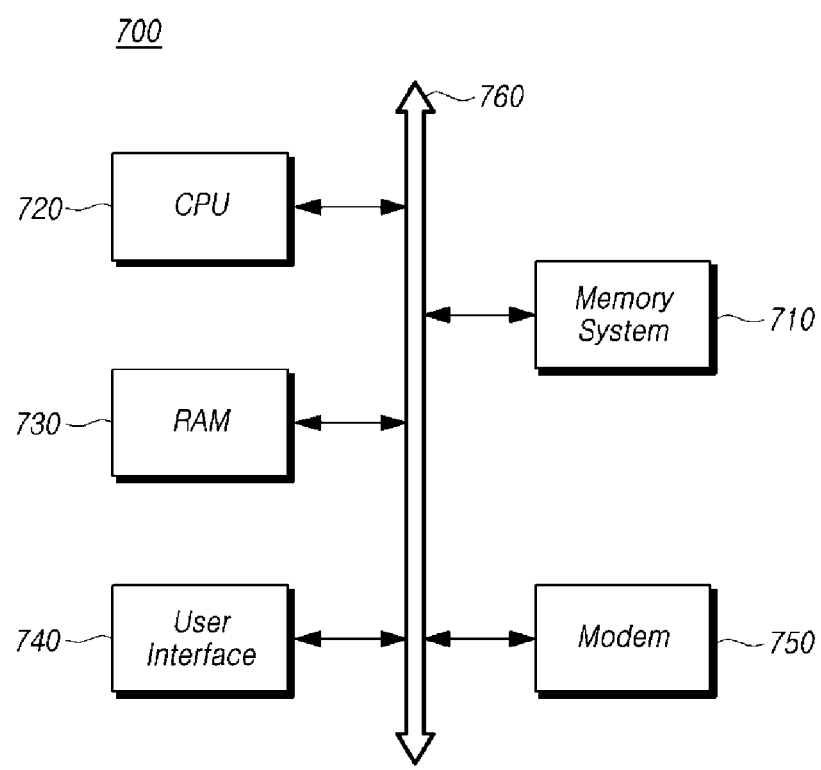
FIG. 25 is a block diagram schematically illustrating a computing system including a three-dimensional memory device in accordance with an embodiment of the disclosure.

FIG. 25 is a block diagram schematically illustrating a computing system including a three-dimensional memory device in accordance with an embodiment of the disclosure.

Referring to FIG. 25, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A three-dimensional memory device comprising:
   a lower stack and an upper stack stacked in a vertical direction and each including a plurality of word lines stacked alternately with a plurality of interlayer dielectric layers in the vertical direction,
   wherein each of the lower stack and the upper stack includes a first cell part, a second cell part, a coupling part that couples the first cell part and the second cell part, and a staircase part that extends parallel to the coupling part between the first cell part and the second cell part and that includes a plurality of pad areas, which are arranged in a stepwise manner and correspond to the plurality of word lines, and
   wherein the coupling part of the upper stack is disposed to overlap with the staircase part of the lower stack in the vertical direction, and the staircase part of the upper stack is disposed to overlap with the coupling part of the lower stack in the vertical direction, and
   wherein each of the first cell part, the second cell part, the coupling part and the staircase part includes the plurality of word lines and the plurality of interlayer dielectric layers alternately stacked in the vertical direction,
   further comprising:
   a plurality of first vertical vias passing vertically through the staircase part of the lower stack;
   a plurality of second vertical vias passing vertically through the coupling part of the lower stack;
   a plurality of third vertical vias passing vertically through the coupling part of the upper stack and coupling to the plurality of first vertical vias, respectively; and
   a plurality of fourth vertical vias passing vertically through the staircase part of the upper stack and coupling to the plurality of second vertical vias, respectively,
   wherein the plurality of first vertical vias correspond to the plurality of word lines, respectively, of the lower stack, pass through the plurality of pad areas of the plurality of word lines, and are electrically coupled to the plurality of corresponding word lines, and wherein the plurality of fourth vertical vias correspond to the plurality of word lines, respectively, of the upper stack, pass through the plurality of pad areas of the plurality of word lines, and are electrically coupled to the plurality of corresponding word lines.

2. The three-dimensional memory device according to claim 1, further comprising:
a plurality of first dielectric patterns, which isolate the plurality of first vertical vias and the plurality of second vertical vias from the plurality of word lines of the lower stack, defined between outer walls of the plurality of first vertical vias and of the plurality of second vertical vias and the plurality of word lines of the lower stack; and
a plurality of second dielectric patterns, which isolate the plurality of third vertical vias and the plurality of fourth vertical vias from the plurality of word lines of the upper stack, defined between outer walls of the plurality of third vertical vias and of the plurality of fourth vertical vias and the plurality of word lines of the upper stack.

3. The three-dimensional memory device according to claim 2, further comprising:
a plurality of conductive hard mask patterns disposed on the plurality of pad areas of the plurality of word lines, respectively, of the lower stack, and electrically coupling the plurality of word lines of the lower stack to the corresponding plurality of first vertical vias.

4. The three-dimensional memory device according to claim 3, further comprising:
a dielectric layer covering the lower stack and the plurality of conductive hard mask patterns,
wherein each of the plurality of first vertical vias has an upper portion passing through the dielectric layer with a width larger than that of a lower portion passing through the staircase part of the lower stack.

5. The three-dimensional memory device according to claim 2, further comprising:
a plurality of conductive hard mask patterns disposed on the plurality of pad areas of the plurality of word lines of the upper stack, respectively, and electrically coupling the plurality of word lines of the upper stack to the corresponding plurality of fourth vertical vias.

6. The three-dimensional memory device according to claim 2, further comprising:
a plurality of hard mask patterns disposed on the plurality of pad areas of the plurality of word lines, respectively, of the lower stack; and
a dielectric layer covering the lower stack and the plurality of hard mask patterns,
wherein each of the plurality of first vertical vias is directly coupled to a corresponding word line by passing through the dielectric layer and the hard mask pattern disposed on the pad area of a corresponding word line.

7. The three-dimensional memory device according to claim 2, further comprising:
a plurality of hard mask patterns disposed on the plurality of pad areas of the plurality of word lines, respectively, of the upper stack; and
a dielectric layer covering the upper stack and the plurality of hard mask patterns,
wherein each of the plurality of fourth vertical vias is directly coupled to a corresponding word line by passing through the dielectric layer and the hard mask pattern disposed on the pad area of a corresponding word line.

8. The three-dimensional memory device according to claim 2, wherein each of the plurality of first vertical vias includes a conductive pad portion, which is disposed on the pad area of a corresponding word line and is coupled to the corresponding word line.

9. The three-dimensional memory device according to claim 2, wherein each of the plurality of fourth vertical vias includes a conductive pad portion, which is disposed on the pad area of a corresponding word line and is coupled to the corresponding word line.

10. The three-dimensional memory device according to claim 1, wherein the upper stack is disposed directly on the lower stack.

11. A three-dimensional memory device comprising:
a lower stack and an upper stack stacked in a vertical direction and each including a plurality of word lines stacked alternately with a plurality of interlayer dielectric layers in the vertical direction, with a surface of word line extending in first and second directions that are substantially orthogonal to the vertical direction,
wherein the plurality of word lines and the plurality of interlayer dielectric layers of each of the lower stack and the upper stack are disposed in
a first cell part and a second cell part spaced apart in the first direction;
a coupling part extending in the first direction to couple the first cell part and the second cell part; and
a staircase part, adjacent to the coupling part in the second direction and extending parallel to the coupling part in the first direction, that includes a plurality of word lines, each word line having a pad area, with the plurality of pad areas of the plurality of word lines arranged in a stepwise manner between the first cell part and the second cell part,
wherein each word line in the staircase part having a pad area is electrically connected to one of a plurality of first vias extending through the pad area in the vertical direction, and the plurality of first vias extend vertically through the staircase part to contact, respectively, a plurality of second vias extending vertically through the coupling part.

12. The three-dimensional memory device according to claim 11, wherein the coupling part of the upper stack is disposed to overlap with the staircase part of the lower stack in the vertical direction, and the staircase part of the upper stack is disposed to overlap with the coupling part of the lower stack in the vertical direction.

13. The three-dimensional memory device according to claim 11, wherein the upper stack is disposed directly on the lower stack.

14. The three-dimensional memory device according to claim 11, further comprising:
a plurality of first dielectric patterns that isolate the first via from the plurality of word lines in the staircase part, defined between an outer wall of the first via and the plurality of word lines in the staircase part; and
a plurality of second dielectric patterns that isolate the second via from the plurality of word lines in the coupling part, defined between an outer wall of the second via and the plurality of word lines in the coupling part.

15. The three-dimensional memory device according to claim 11, further comprising a conductive hard mask pattern disposed on a pad area that of a word line that is electrically connected to a first via extending through the pad area in the vertical direction, wherein the first via is electrically connected to the word line through the conductive hard mask pattern.

16. The three-dimensional memory device according to claim 14, further comprising a conductive hard mask pattern disposed on a pad area that of a word line that is electrically connected to a first via extending through the pad area in the vertical direction, wherein the first via is electrically connected to the word line through the conductive hard mask pattern.

* * * * *